US008213476B1

(12) United States Patent
Wanke et al.

(10) Patent No.: US 8,213,476 B1
(45) Date of Patent: Jul. 3, 2012

(54) INTEGRATION OF A TERAHERTZ QUANTUM CASCADE LASER WITH A HOLLOW WAVEGUIDE

(75) Inventors: Michael C. Wanke, Albuquerque, NM (US); Christopher D. Nordquist, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 28 days.

(21) Appl. No.: 12/868,440

(22) Filed: Aug. 25, 2010

Related U.S. Application Data

(60) Provisional application No. 61/297,872, filed on Jan. 25, 2010.

(51) Int. Cl.
*H01S 5/00* (2006.01)
(52) U.S. Cl. ............. 372/45.012; 372/43.01; 372/50.1
(58) Field of Classification Search ............. 372/45.012
See application file for complete search history.

(56) References Cited

U.S. PATENT DOCUMENTS

| | | | | |
|---|---|---|---|---|
| 4,952,892 A | * | 8/1990 | Kronberg | 333/34 |
| 4,953,166 A | * | 8/1990 | Mooradian | 372/21 |
| 5,363,464 A | * | 11/1994 | Way et al. | 385/125 |
| 5,867,073 A | * | 2/1999 | Weinreb et al. | 333/26 |
| 2005/0063438 A1 | * | 3/2005 | Capasso et al. | 372/45 |
| 2006/0171626 A1 | * | 8/2006 | McNie et al. | 385/14 |
| 2007/0188396 A1 | * | 8/2007 | Griessbaum et al. | 343/786 |
| 2008/0144677 A1 | * | 6/2008 | Belkin et al. | 372/20 |
| 2008/0186113 A1 | * | 8/2008 | Hoover | 333/249 |
| 2008/0219314 A1 | * | 9/2008 | Yoshida | 372/49.01 |
| 2008/0310463 A1 | * | 12/2008 | Maleki et al. | 372/20 |
| 2009/0279576 A1 | * | 11/2009 | Joyner et al. | 372/26 |

OTHER PUBLICATIONS

Danylov et al., "Transformation of the multimode terahertz quantum cascade laser beam into a Gaussian, using a hollow dielectric waveguide", Applied Optics, vol. 46, No. 22, pp. 5051-5055, Aug. 2007.*

Wanke et al., "Terahertz quantum cascade laser integration with on-chip micromachined rectangular waveguides", Proc. of SPIE, vol. 7215, Feb. 2009.*

Rowen, Multi-layer metal micromachining for THz waveguide fabrication, Proc. of SPIE, 2010, vol. 7590, 759009-1 thru 3.

Adam, Beam pattern of terahertz quantum cascade lasers with subwavelength cavity dimensions, Applied Physics Letters 88, 151105 (2006).

Amanti, Horn antennas for terahertz quantum cascade lasers, Electronics Letters, May 10, 2007, vol. 43, No. 10.

Amanti, Low-divergence single-mode terahertz quantum cascade laser, Nature Photonics, vol. 3, Oct. 2009, www.nature.com/naturephotonics.

Barbieri, Integrated Horn Antenna for Microstrip Waveguide THz Quantum Cascade Lasers, CLEO Abstracts (2007), CWP4.

Bowen, Micromachined waveguide antennas for 1.6 THz, Electronic Letters, Jul. 20, 2006, vol. 42, No. 15.

(Continued)

*Primary Examiner* — Jessica Stultz
*Assistant Examiner* — Xnning Niu
(74) *Attorney, Agent, or Firm* — Kevin W. Bieg

(57) ABSTRACT

The present invention is directed to the integration of a quantum cascade laser with a hollow waveguide on a chip to improve both the beam pattern and manufacturability. By coupling the QCL output into a single-mode rectangular waveguide the radiation mode structure can be known and the propagation, manipulation, and broadcast of the QCL radiation can then be entirely controlled by well-established rectangular waveguide techniques. By controlling the impedance of the interface, enhanced functions, such as creating amplifiers, efficient coupling to external cavities, and increasing power output from metal-metal THz QCLs, are also enabled.

30 Claims, 17 Drawing Sheets

OTHER PUBLICATIONS

Cohn, Optimum Design of Stepped Transmission-Line Transformers, IRE Transactions—Microwave Theory and Techniques, Apr. 1955, 16-21.

Danylov, Transformation of the multimode terahertz quantum cascade laser beam into a Gaussian, using . . . , Applied Optics, Aug. 1, 2007, vol. 46, No. 22, 5051-5055.

Desmaris, All-metal micromachining for the fabrication of sub-millimetre and THz waveguide components and circuits, J. of Micromech. and Microeng, 18, 2008, 0905004, 6 pp.

Kazemi, Active micromachined Integrated Terahertz Circuits, International Journal of Infrared and Millimeter Waves, vol. 20 No. 5, 1999.

Kirby, Characterization of Micromachined Silicon Rectangular Waveguide at 400 GHz, IEEE Microwave and Wireless Components Letters, vol. 16, No. 6, Jun. 2006, 366-368.

Kohler, Terahertz semiconductor-heterostructure laser, Nature vol. 417, May 9, 2002, www.nature.com, 156-159.

Lee, High-power and high-temperature THz quantum-cascade lasers based on lens-coupled metal-metal waveguides, Optics Letters, vol. 32, No. 19, Oct. 1, 2007.

Siegel, 2.5 THz GaAs Monolithic Membrane-Diode Mixer, IEEE Transactions on microwave Theory and Techniques, vol. 47, No. 5, May 1999.

Lloyd-Hughes, Coupling terahertz radiation between sub-wavelength metal-metal waveguides and free space using . . . , Optics Express, Sep. 28, 2009, vol. 17, No. 20, 18387-18393.

Nordquist, Properties of Surface Metal Micromachined Rectangular Waveguide Operating near 3 THz, Accepted for publication in IEEE J. of selected topics in Quantum Electronics, Jan. 2011.

Orlova, Antenna Model for Wire Lasers, Physical Review Letters PRL 96, 173904 (2006).

Richter, Terahertz heterodyne receiver with quantum cascade laser and hot electron bolometer mixer in a pulse tube cooler, Applied Physics Letters, 93, 141108-1 thru 3 (2008).

Wanke, Terahertz quantum cascade laser integration with on-chip micromachined rectangular waveguides, Jan. 2009.

* cited by examiner

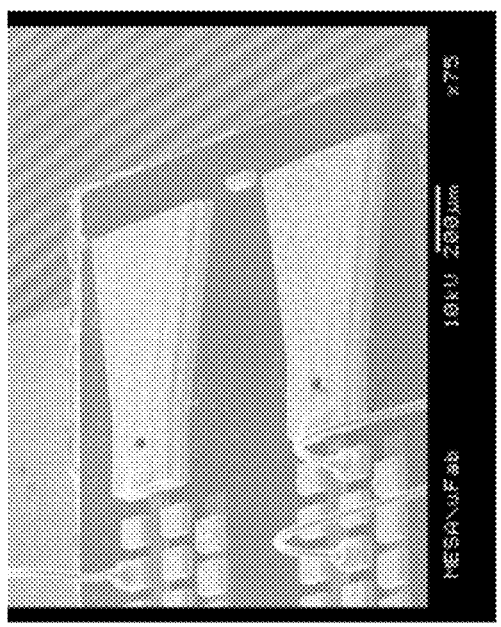
FIG. 14A
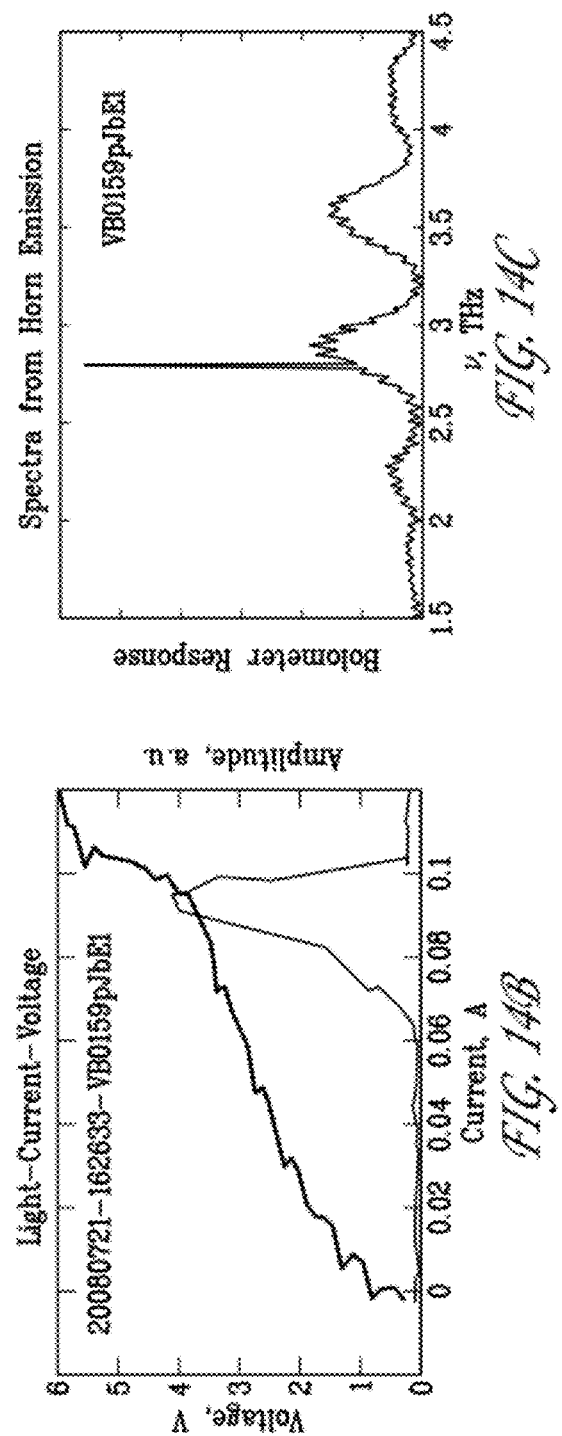
FIG. 14C
FIG. 14B

INTEGRATION OF A TERAHERTZ QUANTUM CASCADE LASER WITH A HOLLOW WAVEGUIDE

CROSS-REFERENCE TO RELATED APPLICATION

This application claims the benefit of U.S. Provisional Application No. 61/297,872, filed Jan. 25, 2010, which is incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to terahertz (THz) technologies and, in particular, to coupling a terahertz quantum cascade laser (QCL) to a hollow waveguide, impedance matching the interface between the laser and the waveguide, and using the impedance matching to enable efficient extraction of light from the QCL off chip or to enable THz photonic integrated circuits on chip.

BACKGROUND OF THE INVENTION

The capability of delivering more than 1 mW of average power at frequencies above about 2 THz combined with very good intrinsic frequency definition make QCLs an appealing solid-state solution as compact THz sources. However, several challenges to the implementation of QCLs as practical THz sources remain. Among these challenges are to couple the QCL power efficiently to other devices (possibly on the same chip) or into free space. To couple the power efficiently to other devices on the same chip, low-loss waveguides are desired, whereas to efficiently propagate the QCL power off the chip requires shaping the non-optimal output beam patterns observed from QCLs into a more useful and predictable beam shape which can be propagated and recoupled to other devices.

There are essentially two types of waveguides of THz QCLs, plasmon and metal-metal. For both, the beam patterns found in the literature show far-field patterns with complex phase structures that are very detrimental for coupling a laser to coherent mixers. See A. J. L. Adam et al., "Beam patterns of terahertz quantum cascade lasers with subwavelength cavity dimensions," *Appl. Phys. Lett.* 88(15), 151105 (2006); and E. E. Orlova et al., "Antenna Model for Wire Lasers," *Phys. Rev. Lett.* 96, 173904 (2006). Even when the beam is nominally Gaussian, poor coupling to external coherent detectors is observed, possibly due to a large number of emitted modes with different phases. See H. Richter et al., "Terahertz heterodyne receiver with quantum cascade laser and hot electron bolometer mixer in a pulse tube cooler," *Appl. Phys. Lett.* 93, 141108 (2008). Groups have tried various approaches to improve the beam quality over the last couple of years. These include soldering a triangular piece of metal on to the end of a QCL, sandwiching the laser between two pieces of silicon to make a capacitive waveguide and horn, placing a silicon lens in contact with the facet, butt-coupling a QCL into a hollow pyrex tube and, more recently, distributed feedback third order Bragg gratings and etched semiconductor horns. See S. Barbieri et al., "Integrated Horn Antenna for Microstrip Waveguide THz Quantum Cascade Lasers," *CLEO Abstracts*, CWP4 (2007); M. Amanti et al., "Horn antennas for terahertz quantum cascade lasers," *Elec. Lett.* 43, 573 (2007); A. W. M. Lee et al., "High-power and high temperature THz quantum-cascade lasers based on lens-coupled metal-metal waveguides," *Opt. Lett.* 32(19), 2840 (2007); A. A. Danylov et al., "Transformation of the multimode terahertz quantum cascade laser beam into a Gaussian, using a hollow dielectric waveguide," *Appl. Opt.* 46(22), 5051 (2007); M. I. Amanti et al., "Low-divergence single-mode terahertz quantum cascade laser," *Nat. Phot.* 3, 586 (2009); and J. Lloyd-Hughes, "Coupling terahertz radiation between sub-wavelength metal-metal waveguides and free space using monolithically integrated horn antennae," *Opt. Exp.* 17(20), 18387 (2009). While each of these approaches improved the beam quality, the first four required individual microassembly by hand, which are not inherently mass-manufacturable in an economic and scalable parallel fabrication process, and the last still couples to multiple modes.

While some of these previous approaches (in particular the $3^{rd}$ order DFB) are beginning to provide reasonable coupling to free space, none of these are good for guiding THz radiation intra-chip to couple to other THz devices. Such THz photonic integrated circuits (ICs) would help close the THz technology gap between microwave electronics and infrared photonics, which currently have much greater functionality because they already integrate multiple devices on the same chip. Traditional waveguides fabricated on semiconductor platforms, such as dielectric guides in the infrared or coplanar waveguides in the microwave regions, suffer high absorption and radiative losses in the THz. The former leads to very short propagation lengths, while the latter leads to unwanted radiation modes and/or crosstalk in integrated devices. For this reason the waveguide of choice at these frequencies are metallic, hollow, rectangular waveguides. For the most part, these waveguides are fabricated in two halves which are sandwiched together to form the enclosed space. As frequencies exceed 1 THz traditional machining becomes much more difficult and prohibitively expensive for broad use, thus micromachining techniques are being developed. See, e.g., P. L. Kirby, "Characterization of Micromachined Silicon Rectangular Waveguides at 400 GHz," *IEEE Micro. Wire. Comp. Lett.* 16(3), 366 (2006); and V. Desmaris, "All-metal micromachining for the fabrication of sub-millimeter and THz waveguide components and circuits," *J. Micromech. Microeng.* 18, 095004 (2008). These split blocks require careful insertion of and subsequent connection by hand to active devices. Only a couple efforts have tried to fabricate monolithic waveguides on a chip with or without integrated devices. See J. W. Bowen, "Micromachined waveguide antennas for 1.6 THz," *Elec. Lett.* 42(15), (2006); and H. Kazimi, "Active micromachined integrated terahertz circuits," *Int. J. Inf. Millimeter Waves* 20(5), 967 (1999).

However, a need remains for a laser source monolithically integrated with a hollow waveguide on the same chip. This integration would allow coupling to mature rectangular waveguide components and circuits, guiding the emission of QCL radiation around on a chip and controlling the emission beam pattern and number of radiated modes by controlling the shape of the waveguide and horn antennas coupled to the waveguides. In addition, by altering the geometry of the interface between the laser and rectangular waveguide, the coupling of the QCL to the outside world could be controlled.

SUMMARY OF THE INVENTION

The present invention is directed to an integrated quantum cascade laser and hollow waveguide device, comprising a substrate; a hollow waveguide on the substrate; a quantum cascade laser, comprising a waveguided heterostructure active region for generation of laser light, on the substrate; and an interface between an end facet of the quantum cascade laser and an entrance end of the hollow waveguide for coupling of the laser light from the quantum cascade laser into the hollow waveguide or for coupling external light from the hollow waveguide into the quantum cascade laser. For example, the interface can comprise an abrupt transition, a stepped transition, or a tapered transition to control the impedance mismatch between the quantum cascade laser and the hollow waveguide. For example, the interface can be adapted to match the impedance of the quantum cascade laser to the impedance of the hollow waveguide, match the laser facet loss to the laser cavity loss to improve the efficiency of the quantum cascade laser, or to optimize the output power of the quantum cascade laser.

As an example of the present invention, integration of THz QCLs with single-mode 75 μm×37 μm rectangular waveguide components, including horn antennas, couplers, and bends, for operation at 3 THz were designed and fabricated using thick gold micromachining. Measurements on the isolated waveguide components exhibited fairly low loss and integration with THz QCLs was demonstrated. The successful integration of THz QCLs with micromachined waveguides on the same chip, along with other passive waveguide components, such as tees and couplers, enables integrated THz-circuits-on-a-chip. Further, this technology enables coupling between the QCL and the outside world.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

FIG. 1 is a schematic illustration of a quantum cascade laser (QCL) coupled to a rectangular waveguide (RWG) with an exemplary abrupt transition.

FIG. 14A is an SEM image of two QCLs with the revised lower metal-stress-contacts integrated with horn antennas. FIGS. 14B and 14C are graphs of L-I-V and spectra emitted from an integrated horn antenna. The L-I-V shows a very low threshold current, and the laser emission emits only a single frequency.

DETAILED DESCRIPTION OF THE INVENTION

The present invention is directed to the integration of a QCL with a hollow waveguide to improve the laser beam pattern with a manufacturable method. For example, by coupling the QCL output into a single-mode rectangular waveguide (RWG) the radiation mode structure will be known and the propagation, manipulation, and broadcast of the QCL radiation can then be entirely controlled by well-established RWG techniques. Further, many existing mixers are already embedded in RWG blocks. By integrating a QCL into a compatible block, the QCLs can be mated more quickly with this existing technology and infrastructure, thereby providing a more compact and robust system than using quasi-optics. Integrating QCLs into RWGs also enables complete on-chip THz circuits.

Because typical QCL frequencies are greater than 1 THz, the dimensions of single-mode rectangular waveguide at these wavelengths are on the order of tens of microns. While such small THz waveguides can be made by traditional metal machining, traditional machining is typically expensive, slow, and difficult to reconcile with the electrical connections needed to support high DC bias currents required to operate a QCL embedded in such a waveguide. See P. Siegel et al., "2.5-THz GaAs Monolithic Membrane-Diode Mixer," *IEEE Trans. Microw. Theory Tech.* 47(5), 596 (1999).

Therefore, the present invention can use a lithographic micromachining method to fabricate small, single-mode rectangular waveguide structures. Such a micromachining method has the advantage of being amenable to large-scale production and can be tailored to suit the unique demands of a QCL source. The traditional rectangular waveguide method comprises fabricating two halves of a waveguide block and separately bolting them together, as was recently demonstrated with similar multi-layer lithographic techniques at lower frequencies. See V. Desmaris et al., "All-metal micromachining for the fabrication of sub-millimeter and THz waveguide components and circuits," *J. Micromech. Microeng.* 18, 095004 (2008). However, because most QCLs are edge emitters with a surface-normal E-field polarization, the integrated waveguide preferably has the short wall in a direction normal to the substrate, which reduces the required height but places any wafer bonds in high-current areas. Because of this, and to ensure good coverage over surface topography, the present invention uses monolithic waveguides fabricated directly onto the laser chips.

Figure 1A:
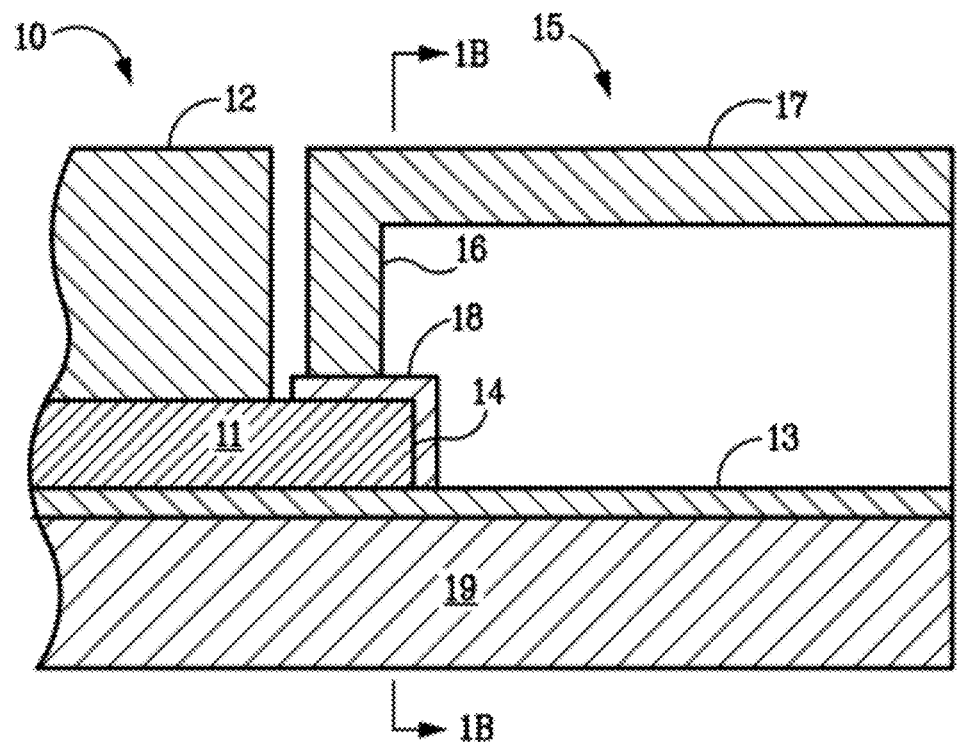
FIG. 1A is a side-view illustration of the integrated QCL-RWG.
Figure 1B:
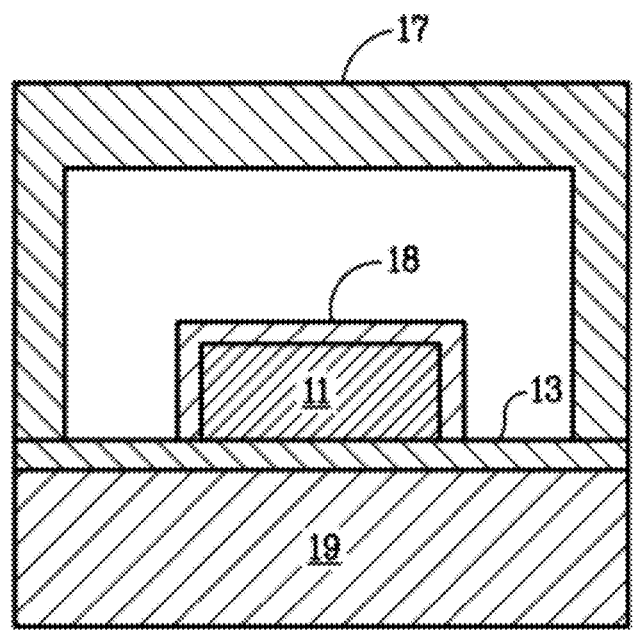
FIG. 1B is an cross-sectional end-view illustration of the integrated QCL-RWG.

FIG. 1 shows a schematic illustration of a QCL 10 integrated with a hollow waveguide 15 according to the present invention. The QCL 10 comprises a layered heterostructure 11 of two or more semiconductor alloys forming an active semiconductor core, or gain medium, between top and bottom waveguide layers 12 and 13. The laser dimensions can be very diverse. For example, the laser can be less than 30 microns on a side and up to 300 microns wide by more than 3 mm long. Further, the laser does not need to be purely rectangular, as many shapes have been used (e.g., circles, ovals, corrugated structures). The design of the heterostructure active region can vary, depending on the laser requirements. For example, the heterostructure can comprise alternating thin layers of gallium arsenide (GaAs) and aluminum gallium arsenide (AlGaAs). For example, the heterostructure can be built up by molecular beam epitaxy (MBE) on a semi-insulating gallium arsenide substrate. Such GaAs/AlGaAs heterostructures can typically operate in a range of about 1 to 5 THz. However, other heterostructure designs and other semiconductor alloys can be used to build up heterostructures that operate at other terahertz frequencies. For example, the laser can comprise other high-quality laser materials, including InAs-based materials (e.g., InGaAs/AlInAs on InP), GaN-based materials, tellurides, and antimonides. See R. Kohler et al., "Terahertz semiconductor-heterostructure laser," *Nature* 417, 156 (2002), which is incorporated herein by reference. The substrate 19 preferably has an expansion coefficient similar to the QCL material. As noted above, the substrate can be GaAs for a GaAs laser. However, a highly polished piece of CuW or other material with a thermal expansion coefficient matched to GaAs could also be used. The top and bottom waveguide layers 12 and 13 are typically metal or doped semiconductor layers that keep the mode in the laser cavity. For integration with rectangular waveguides, a metal-metal waveguiding scheme is preferred. Typical metals include Au, TiAu, CrAu, PdGeAu, or NiAuGe. The waveguide layers also provide electrical contacts to the semiconductor core.

The back wall 16 and the top and side walls 17 of the hollow waveguide 15 can also be a metal, such as gold, or doped semiconductor. A transparent insulator 18, such as $SiO_2$ or SiN, can be applied conformally to the end facet 14 of the laser 11 to electrically isolate the laser from the waveguide walls. The hollow waveguide 15 is preferably a rectangular shape, although other shapes can also be used. A rectangular waveguide will be used in the example devices described hereinafter. The waveguide 15 can bend or be straight. The waveguide 15 is preferably single-mode, although multi-mode waveguides can be used for some applications.

Metal-metal waveguided QCLs have better heat extraction and lower threshold currents than plasmon waveguide devices. However, due to the impedance mismatch between the laser and free-space at the end facet, little power couples out of these types of devices. By lowering the impedance mismatch, more power can be extracted. By changing the interface at the end facet between the laser and the waveguide this trade-off can be engineered for the application at hand. By controlling the impedance mismatch, the performance of the laser can be altered in important ways. For example, the interface can be adapted to match the impedance of the quantum cascade laser to the impedance of the hollow waveguide. Complete impedance matching can be used to enable broad band tuning of the QCL output with external feedback, such as provided by an external cavity. Further, the impedance mismatch can be tuned to maximize the efficiency of the laser (typically done by setting the facet loss equal to the cavity loss), or to increase the output power of the QCL by lowering the facet reflectivity. Since the waveguide of a metal-metal THz QCL is essentially a microstripline, microwave techniques can be borrowed to engineer the impedance mismatch between the QCL and a metallic hollow rectangular waveguide. The impedance between the QCL and the embedding entrance end of the rectangular waveguide can be engineered in various ways, for example by creating a stepped fin-line structure with ¼-wave transformers or by tapering the laser facet as it enters the waveguide, as will be further described below.

QCLs can provide lots of power and very narrow linewidths which are both excellent for spectroscopy, communication, or RADAR/SAR type applications. Unfortunately, even though the lasers have an intrinsic bandwidth greater than 300 GHz, a stand-alone laser emits only a specific frequency (or a few frequencies) that can typically only be tuned by a few GHz. A typical approach to tune lasers used at shorter NIR and VIS wavelengths is to use an external cavity to tune the laser. This requires that at least one of the laser facets be impedance matched (or nearly matched) so that light can leave the laser and be focused back into the laser so that the external cavity will define the laser frequency. Because the mode shape in THz QCLs does not approximate a Gaussian, standard thin films applied to the facets will not provide a perfect antireflection coating. In addition, since the laser facet is small compared to a wavelength, much of the light that is coupled out will not couple back into the laser. Thus stand-alone THz QCLs do not couple well to external cavities. For metal-metal waveguides these problems are much worse. Both problems can be addressed by coupling the QCL to a rectangular waveguide. With a proper interface geometry, the impedance can be matched so there will be no reflection and the out-coupling and in-coupling will be much better because a horn antenna attached to the waveguide can be much larger than the facet and also larger than a wavelength and can be engineered to provide a good beam shape. Thus a waveguide-coupled QCL is a perfect device for external cavity tuning the QCL. This enables tuning of the emission frequency over the whole gain bandwidth of the laser.

In addition, this integration enables the use of the QCL gain medium as an amplifier. If either of the end facets of the QCL is impedance matched, the resulting loss of feedback will prevent lasing, but any radiation within the wide frequency bandwidth of the gain that is injected and propagates through the structure will be amplified. There are other sources of THz radiation that are broadly tunable, but they produce a very small amount of THz power. By impedance matching one or both ends of the QCL and then focusing light from an external weak source into the waveguide on one end, the light will propagate through the active region and be amplified and emitted out the other end. By tuning the weak source and amplifying it with the QCL active material, significantly higher powers of tunable THz radiation can be generated.

Rectangular Waveguide Fabrication

The fabrication of a rectangular waveguide can use multilayer lithography. See Nordquist et al., "Design, Fabrication, and Characterization of Metal Micromachined Rectangular Waveguides at 3 THz," *Proc.* 2008 *IEEE Antennas and Propagation Soc. Int. Sym.*, (2008); and Rowen et al., "Multilayer metal micromachining for THz waveguide fabrication,"

Figure 2A:
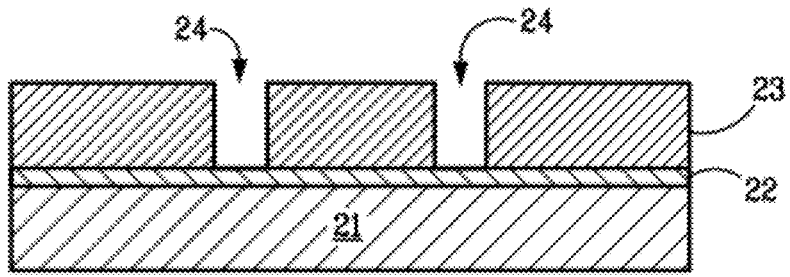
FIG. 2 is a schematic end-view illustration of a method to fabricate a rectangular waveguide.
Figure 2B:
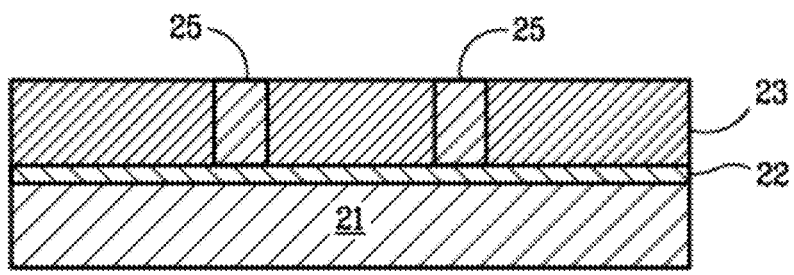
Figure 2C:
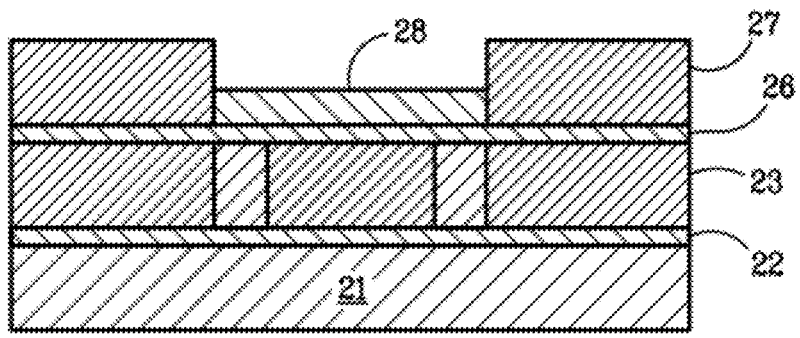
Figure 2D:
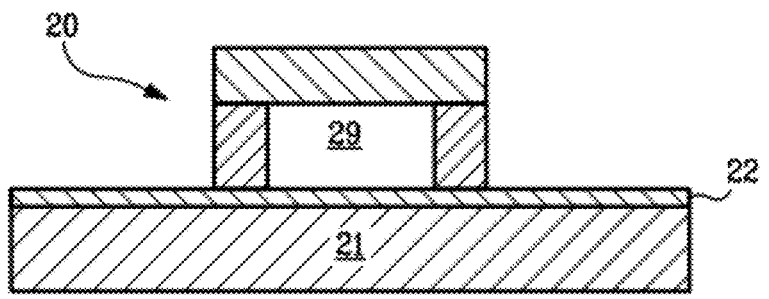

Proc. SPIE 7590, 759009 (2010); which are incorporated herein by reference. A schematic end-view illustration of an exemplary fabrication method is shown in FIG. 2. Each layer of the fabrication method comprises depositing a seed metal, creating a mold in photoresist, and electroplating metal into the mold to fill the openings in the resist. The fabrication method can be applied to any relatively planar surface. As shown in FIG. 2A, an electrically conducting seed layer 22 is deposited on a substrate 21 to facilitate the subsequent buildup of the waveguide side walls. For the purposes of creating the waveguide the substrate 21 can be any material (e.g., glass, silicon, or GaAs). For example, fully integrated waveguides can be fabricated on GaAs substrates. Stand alone waveguides can be fabricated on a bare silicon substrate. The seed layer 22 is conductive and can range in thickness from a few tens of nanometers to microns. For example, the seed layer can be a layered stack of titanium and gold. To provide good adhesion and low waveguide losses the seed layer can be 1 micron of gold on top of 20 nm of titanium. Next, a first photoresist layer 23 is deposited on the seed layer. The photoresist can be a negative or positive photoresist. A lithographic process can be used to pattern the photoresist 23 to provide openings 24 for a side wall mold. Patterning the first photoresist layer 23 defines the height and directionality of the waveguide side walls 25, and also provides a platform for the second lithographic step. For example, the height of the side walls can be 30-40 µm. Longer wavelengths require larger waveguides with higher side walls. The impedance can be tuned by changing the height and width of the waveguide. As shown in FIG. 2B, the side wall material 25 can be electrodeposited into openings 24 in the photoresist mold. For example, the deposited waveguide material can be gold. A gold sulfite chemistry can be used for the electroplating process, comprising a separate make up, replenisher, and brightener. As shown in FIG. 2C, a second seed layer 26 can be deposited on the planarized first layer. A waveguide lid can be defined by patterning a second photoresist layer 27 and electroplating the lid layer 28 into the opening in the patterned photoresist layer. As shown in FIG. 2D, the photoresist layers 23 and 27 and the second seed layer 26 can be removed to provide a hollow channel 29 within the rectangular waveguide 20. Removing the photoresist from the outside of the waveguide after electroplating is straight forward. Resist removal from inside of the waveguide can be more difficult. Therefore, release holes (visible in FIG. 3) can be provided along the length of the waveguide lid 28 to enable removal of the resist from the inside of the waveguide channel. Alternatively, some resists can be used that do not require release holes, even for small dimensions. A solvent can be used for stripping the resist inside of the waveguide. Mega sonic agitation can be applied to the solvent to help strip the resist throughout the entire length of the waveguide channel.

Characterization of Empty Stand-Alone Free-Space-Coupled Rectangular Waveguides

Rectangular waveguides have not been extensively studied and characterized for frequencies much above 1 THz. Therefore, the free-space-coupling characteristics of empty standalone waveguides were examined before integrating the waveguides with lasers. Single-mode 75 µm×37 µm rectangular waveguides and components, including horn antennas, couplers, and bends, for operation at about 3 THz were designed and fabricated on a bare silicon substrate. These waveguides were designed to couple to free-space using H-plane horn antennas on both ends of the guides. By using identical horn structures on all waveguide variations, the measured differences of THz propagation coupled into and out of the waveguides can be related to the waveguide itself.

A waveguide structure can be designed by scaling from published or reported designs in the microwave frequency range. For the present example, dimensions were determined by shrinking WR-90 X-band (8.2-12.4 GHz) waveguide designs by a factor of 30 to cover the 2.5 THz-3.5 THz bands. The calculated TE10 cutoff frequency was 2 THz, with the TE20 and the TE01 mode cutoff at 4 THz and the TM11 mode cutoff at 4.5 THz. The initial design was simulated using perfect conductor boundary conditions with Ansoft High Frequency Structure Simulator (HFSSTM). The initial design was then adjusted to provide a realistically fabricatable structure. These adjustments included adding release holes, forcing any vertical edge to be straight, and modifying layer widths, thicknesses, and setbacks to reflect fabrication limitations. The waveguide width can be modulated to minimize reflections from the release holes.

Figure 3A:
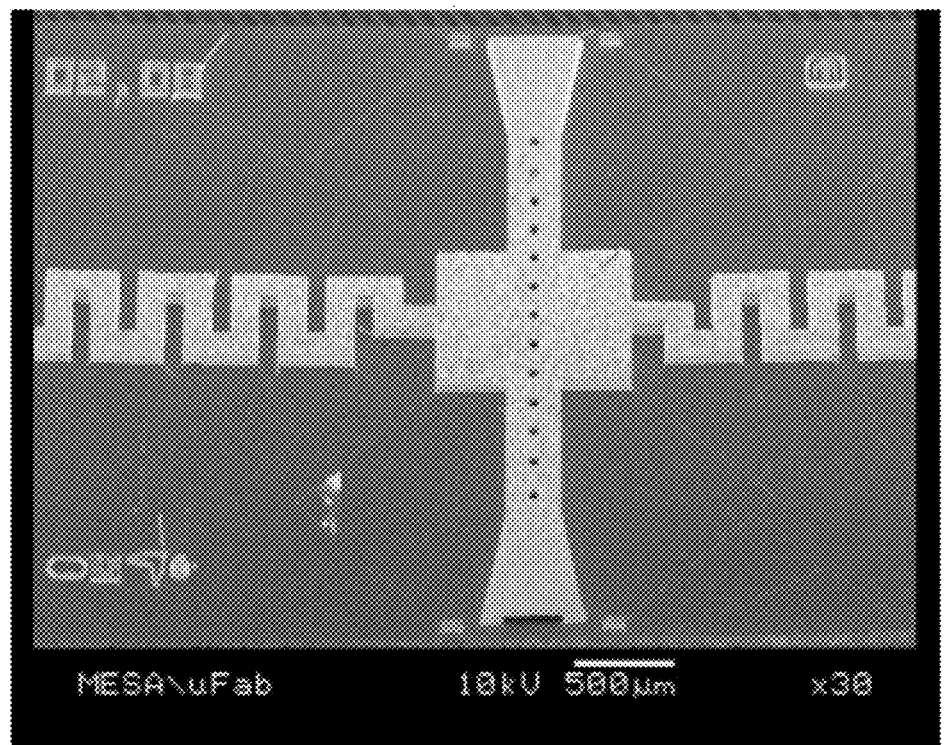
FIGS. 3A and 3B are scanning electron micrographs (SEMs) of two free space coupled rectangular waveguides showing horns on both ends of the waveguides for coupling light in and out.
Figure 3B:
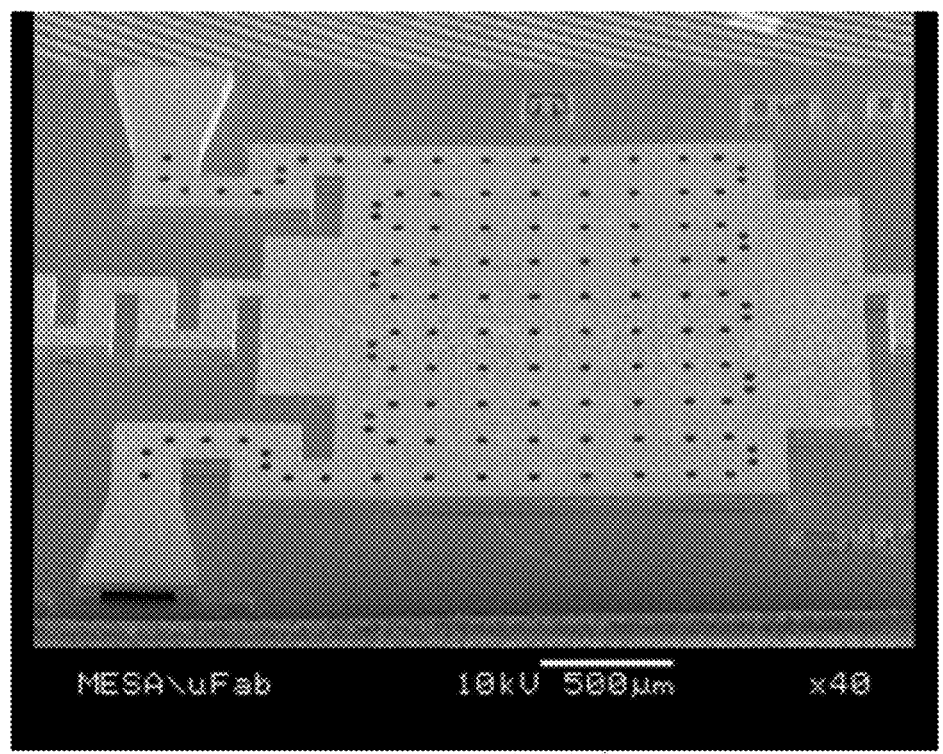

FIGS. 3A-B show scanning electron micrographs (SEMs) of two free-space coupled rectangular waveguides having horns on both ends of the waveguides for coupling light in and out. The horns are directly across from each other on the chip with apertures typically 5 mm apart from each other. The waveguide path follows the visible release holes. FIG. 3A shows a straight waveguide of length 2.6 mm. FIG. 3B shows a longer waveguide with 24 bends and length 20.25 mm. Lengths do not include the horns.

Figure 4:
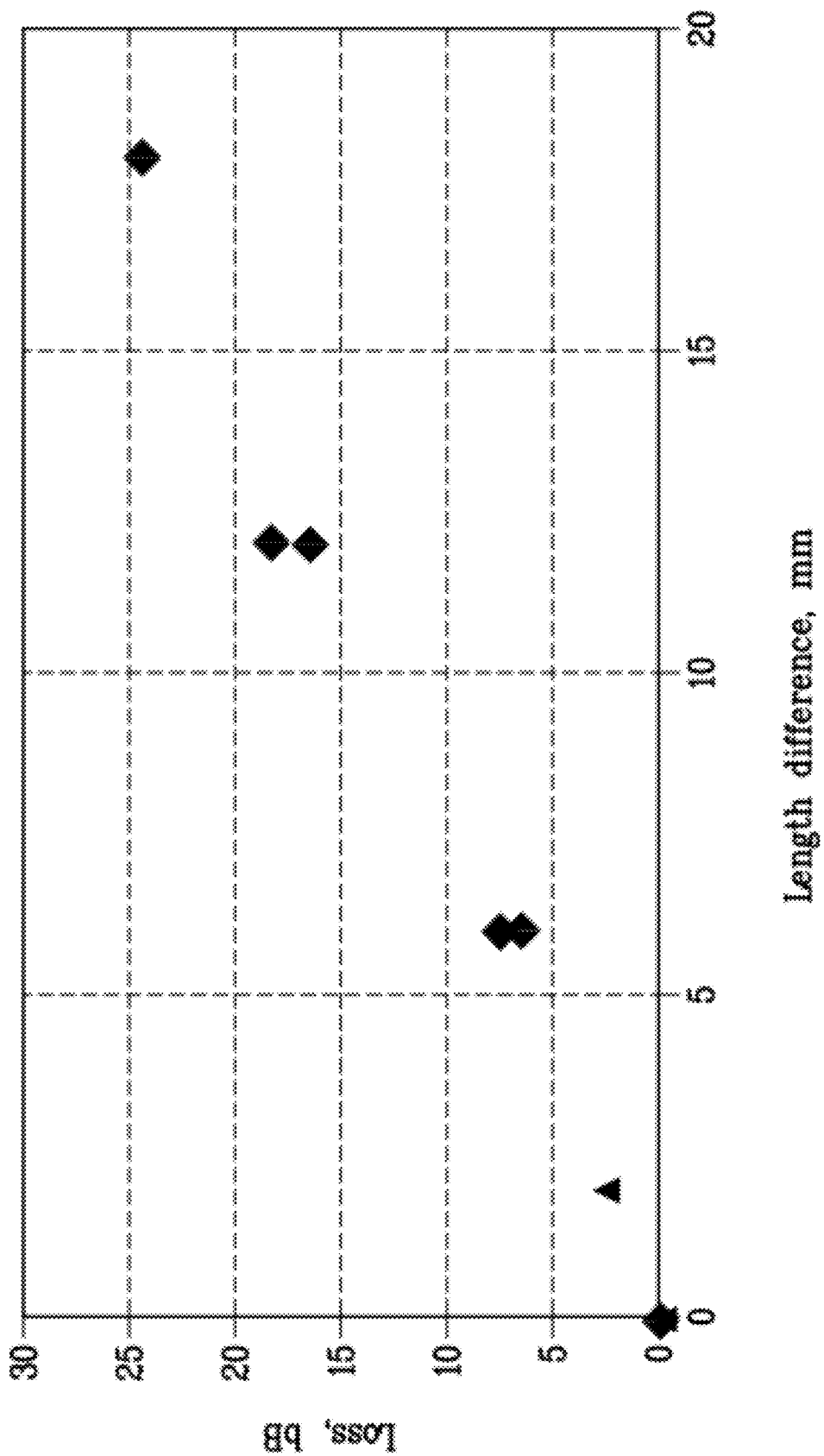
FIG. 4 is a graph of loss vs. difference in length for a rectangular waveguide.

An array of empty waveguides was fabricated on a silicon substrate to obtain loss-per-length information. The waveguides were characterized using a molecular gas far-infrared laser source (FIRL). This FIRL source can generate radiation at a set of distinct lines by pumping select gasses with a $CO_2$ laser, with output powers up to a few 10's of mW's depending on the frequency of operation. Each waveguide had the same number of bends but with lengths ranging from 14.2 mm to 38.6 mm. Data from the waveguides were analyzed to obtain the loss of the waveguides as a function of length. FIG. 4 is a graph of loss vs. difference in length for two different waveguide samples at 3.1 THz (triangles) and 2.56 THz (diamonds). Fitting a straight line to the points on the plot gives a loss of 1.4+/−0.15 dB/mm, which is equivalent to 0.14 dB/λ. This experimental loss compares favorably to 0.2 dB/λ at 100 GHz and 0.6 dB/λ at 300 GHz for commercially available waveguides. Comparing waveguides with and without bends, a bend loss of 0.15±0.15 dB was estimated.

While assuming a purely real metal boundary condition suffices in the microwave range, there is disagreement as to whether these types of boundary conditions can be used in the 1-3 THz range. At these frequencies, the surface impedance of the metal has a non-negligible imaginary component, given by the Drude model for metal conductivity. A simplified model for this conductivity can be adapted from Zhao:

$$\sigma = \sigma_{dc} \left[ \frac{1}{1 + (\omega\tau)^2} + \frac{j\omega\tau}{1 + (\omega\tau)^2} \right]$$

where $\sigma_{dc}$ is the metal conductivity at DC, $\omega$ is the signal radian frequency, and $\tau$ is the metal average collision time. See Y. Zhao and D. R. Grischkowsky, "2-d terahertz metallic photonic crystals in parallel-plate waveguides," *IEEE Trans. Microwave Theory Tech.* 55, 656 (2007). As the signal frequency increases, the real component of the conductivity decreases and the imaginary component increases. At 3 THz the real conductivity of ideal gold is 0.86 of the DC conductivity and the imaginary component is 0.35 of the DC conductivity (using τ=18 fs). See M. Walther et al., "Terahertz conductivity of thin gold films at the metal-insulator percolation transition," *Phys. Rev. B* 76, 125408 (2007). The surface impedance determines the waveguide loss, and is given by:

$$R_s = \sqrt{\frac{\omega\mu}{2\sigma}}$$

where µ is the permeability of the medium. Using this equation, the surface impedance for ideal gold ($\sigma_{dc}$=4.1×10⁷Ω⁻¹ m⁻¹) is 0.54Ω at DC and (0.6+j1.6)Ω at 3 THz. See D. M. Pozar, *Microwave Engineering* (1st ed.), Addison-Wesley, Reading, Mass. (1990).

To determine the impact of the metal conductivity, the loss of a 75 µm×37 µm gold rectangular waveguide was calculated and simulated. Using the standard waveguide design and loss equations given by Pozar, the waveguide loss calculated was 4 dB/cm at 3 THz, assuming the DC conductivity of gold. The simulated loss using HFSS was 6 dB/cm using the DC conductivity of gold, and 7 dB/cm using the complex conductivity of gold. The guide wavelength was identical in all cases, suggesting that perfect-E boundary conditions can be used with negligible error during early parts of designs, and that the complex conductivity primarily impacts loss in a predictable way. This is consistent with the observations by Lucyszyn. See S. Lucyszyn, "Accurate cad modeling of metal conduction losses at terahertz frequencies," *Proc. IEEE Symp. Electron Dev. Microw. Optoelec. Apps.*, 180 (2003). The measured loss was a factor of two higher than the HFSS simulations, which is fairly good agreement, especially since the HFSS results do not take into account possible effects due to surface roughness or contamination.

Impedance Matching at the QCL-RWG Interface

The interface between the fields propagating in a laser waveguide and the fields in a hollow rectangular waveguide determines the impedance matching of the QCL to the rectangular waveguide. The effective impedance mismatch at this interface between the two separate regions has significant impact on the integrated device performance. If the impedance has a large mismatch, very little power will exit the laser. While this will lead to low output powers, it can also lower the threshold current and probably raise the operation temperature of the laser. If there is no mismatch, there will be no feedback and lasing will cease. In this case, some additional feedback mechanism, such as a distributed feedback grating or an external cavity, can be provided to get lasing again. A possible advantage of using an external grating for feedback is the ability to tune the laser frequency over its entire gain bandwidth. For intermediate values of the mismatch, the optimal power output or the optimal efficiency can be obtained by designing the interface to go between these extremes. The impedance between the QCL and the embedding entrance end of the rectangular waveguide can be engineered in various ways. Examples of exemplary transitions are described below.

Abrupt QCL-RWG Transition

In terms of integration and device fabrication, the simplest QCL-WG interface is the abrupt transition, wherein the end facet comprises a vertically etched wall of the laser heterostructure that is perpendicular to the laser axis. For integration with a QCL, a hollow rectangular waveguide can be similarly fabricated on a GaAs substrate with a THz QCL already fabricated on the surface. As an example, a laser was fabricated that was 2000 µm long, about 10 µm tall, and 65 µm wide. The waveguide for the laser itself was a metal-metal type waveguide, which was essentially a microstripline confining the THz radiation of the active region to stay between two metal plates. The hollow channel of the rectangular waveguide was 37 µm high by 75 µm wide. The entire laser end facet can be inserted directly into the entrance end of the rectangular waveguide, as illustrated by the example shown in FIG. 1. Although this example uses a vertical end facet, non-vertical etched facets can also be used.

Figure 5:
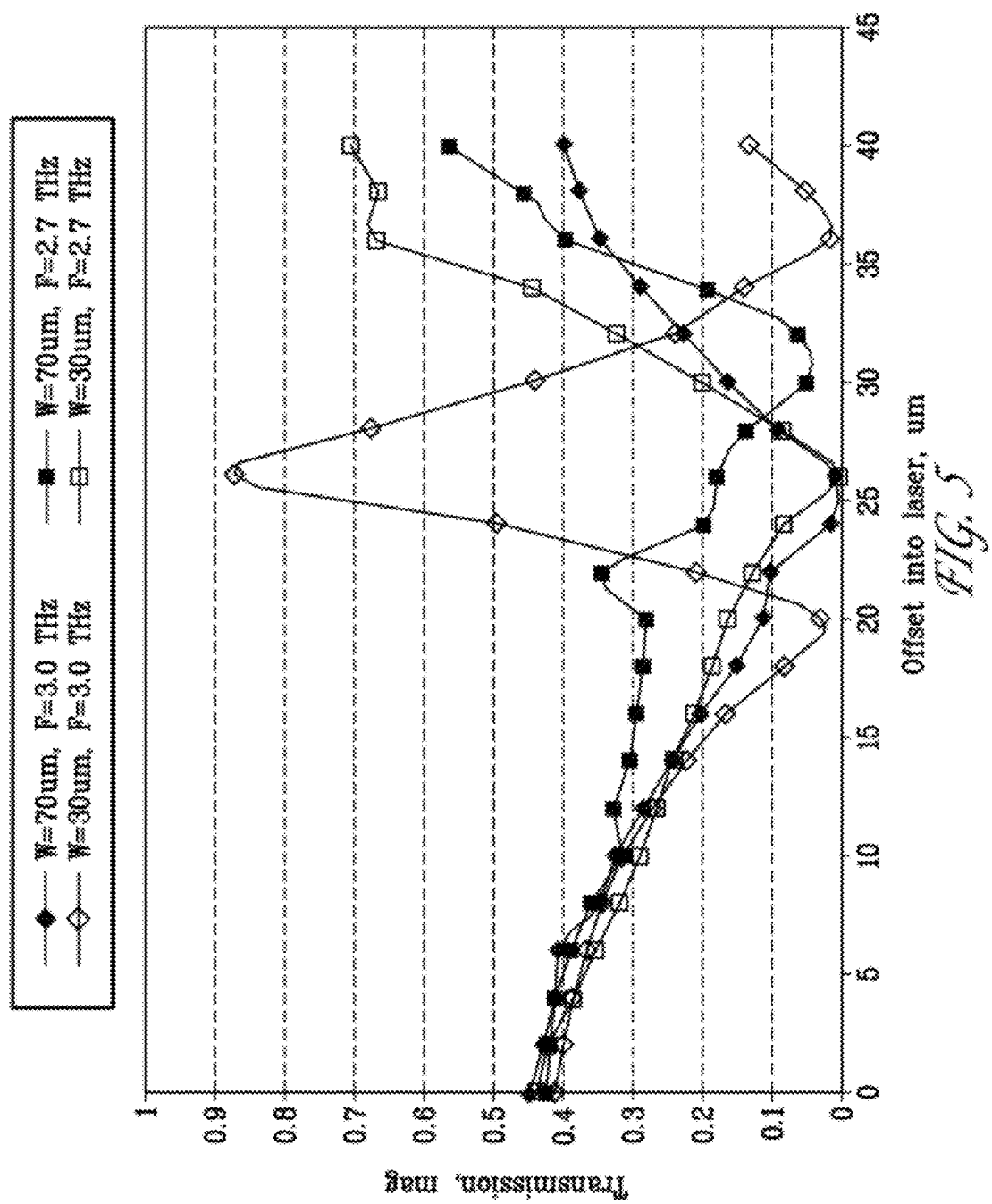
FIG. 5 is a graph of the simulated transmission for an abrupt QCL-RWG transition as a function of laser offset.

FIG. 5 is a graph of the simulated transmission for an abrupt QCL-RWG transition as a function of laser offset (the distance that the laser facet embeds into the entrance end of the hollow waveguide from the back waveguide wall) at 2.7 THz and 3.0 THz. The abrupt transition has poor (<50%) coupling to the waveguide, and is sensitive to the placement of the laser within the waveguide. The laser widths in the simulation were 30 µm and 70 µm. The transmission is 40% when the laser is flush with the end of the waveguide, and nears 0% when the laser end facet protrudes λ/4 into the waveguide. Generally, the transition is overmoded at offset lengths longer than the first transmission minimum, making the higher coupling values at the higher offsets not useful for practical applications. For comparison, the approximate coupling for a typical metal-metal QCL to free space is only about 5%, so the coupling to a hollow waveguide can significantly increase the output of metal-metal waveguided QCLs.

Stepped QCL-RWG Transition

Figure 6:
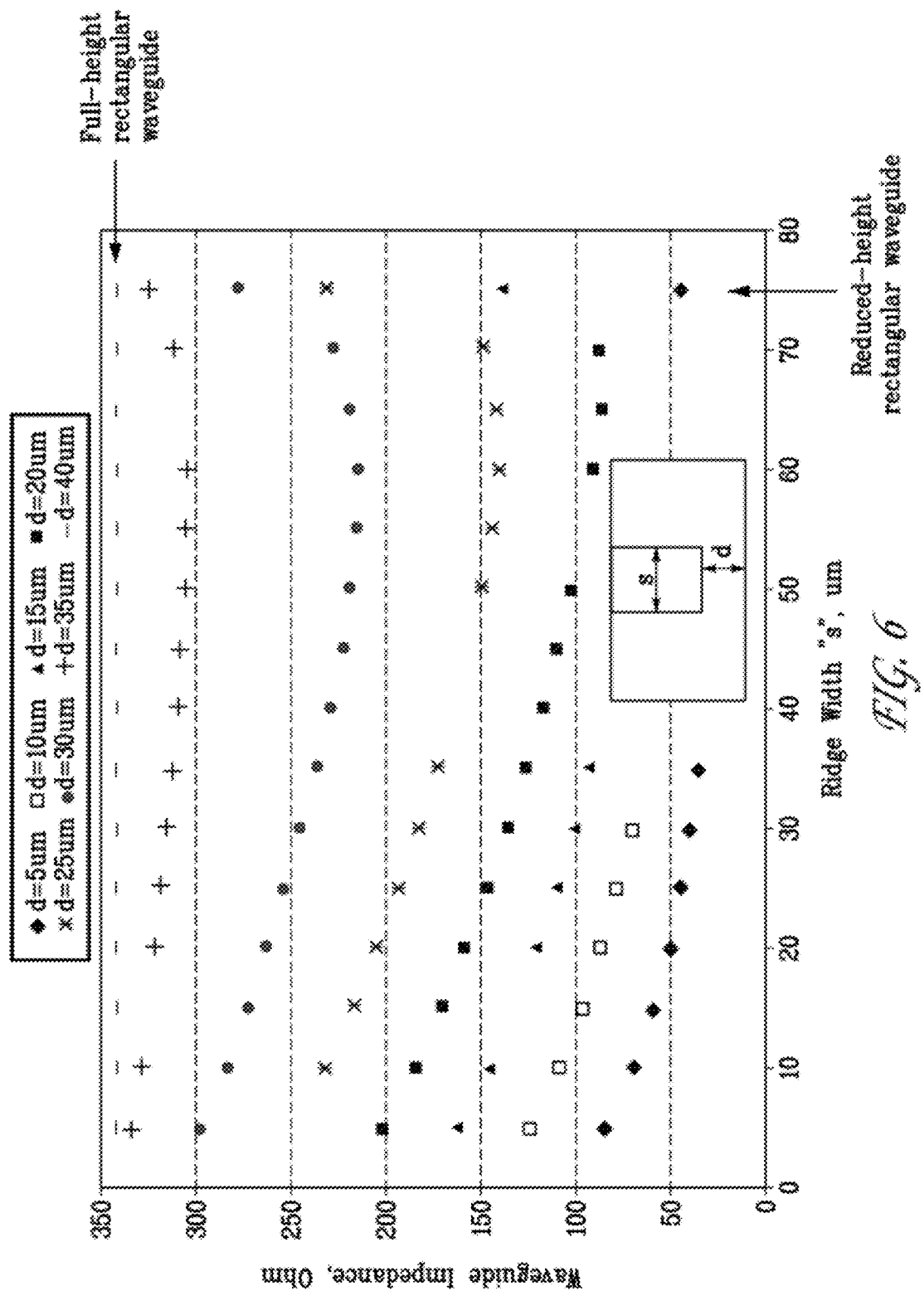
FIG. 6 is a graph of the characteristic impedance at 2.7 THz of a ridge waveguide as a function of the ridge gap and width. The outer waveguide dimensions are 75 μm×37 μm. The inset is a cross section of the waveguide.

Complete coupling occurs when the interface is impedance matched. The key challenge is in the transition from a high-index GaAs-filled parallel-plate or microstrip transmission line with a characteristic impedance of ~35Ω to an air-filled rectangular waveguide with a characteristic impedance of ~360Ω. The most practical transition from a microstripline to a rectangular waveguide is a stepped or continuously tapered ridge waveguide (see inset in FIG. 6 for a ridge waveguide cross-section), where the bottom of the narrow ridge couples to the tightly confined microstrip mode of the QCL. See J. Izadian and S. M. Izadian, *Microwave Transition Design*, Artech House, Norwood, Mass. (1988). The total height of the ridge waveguide is constant, but the ridge width (s in FIG. 6) becomes shallower and wider as it tapers toward the top of the waveguide. While closed form solutions for ridged waveguides do exist, because of the geometrical constraints and the desire to design a matching network, waveguides were simulated to obtain an understanding of the waveguide impedance as a function of ridge gap (d in FIG. 6) and width within a waveguide of total dimensions of 75 µm×37 µm. FIG. 6 shows that the ridge can be used to vary the waveguide impedance predictably from ~30Ω to the 340Ω of the full-height rectangular waveguide. The lowest impedances were for ridges with narrow gaps, which matched the microstrip field profile well.

To simplify design and fabrication, a 5-section stepped impedance transform was used for the transition. See S. B. Cohn, "Optimum design of stepped transmission-line transformers," *IRE Trans. Microw. Theory Tech.*, 16 (1955). Using the approach described by Cohn, the desired impedance values were determined to be 35Ω (the microstrip line), 44Ω, 79Ω, 154Ω, 277Ω, and 340Ω (the rectangular waveguide).

Initial values of width and gap that satisfied these impedances were chosen from FIG. 6, with each segment initially 90° at the 2.7 THz center frequency.

Though the stepped transformer interface matches the impedance well, it does not take the field profiles into account, particularly at the laser facet. In order to match the field profile at the laser facet, a single-stage transition from the laser facet to a ridge waveguide of arbitrary impedance was designed. In this method, the impedance of the first stage is set by the ridge waveguide dimensions that best match the laser rather than the impedance defined in the synthesis procedure. Once the impedance of the first stage is defined, the stepped impedance transformer can be used to transition from the first section of waveguide to rectangular waveguide. When this approach was taken, the desired impedance values were 35Ω (the microstrip line), 70Ω (determined through simulations of laser to waveguide), 99Ω, 157Ω, 249Ω, and 340Ω (the rectangular waveguide).

The structure was then simulated in HFSS and optimized (primarily the matching lengths) for >15 dB return loss from 2.5 THz to 3.0 THz. The best dimensions for the structure are summarized in Table 1, with stage 0 as the laser and stage 5 as the rectangular waveguide. This particular design was for a laser bar 25 μm wide. Interestingly, the optimum lengths for the first two stages are far less than the expected λg/4. Note that the ridge width, s, is constant in this design, and only the gap, d, varies. In general, either s or d can be varied or both s and d can be varied.

TABLE 1

Dimensions from THz QCL-WG Stepped Matching Network

| Stage | $Z_o$ | d (μm) | s (μm) | L (μm) |
|---|---|---|---|---|
| 0 | 35 | — | — | — |
| 1 | 70 | 4 | 4 | 16.6 |
| 2 | 99 | 8 | 4 | 20.7 |
| 3 | 157 | 16 | 4 | 31.9 |
| 4 | 249 | 26 | 4 | 31.5 |
| 5 | 340 | — | 37 | — |

Figure 7:
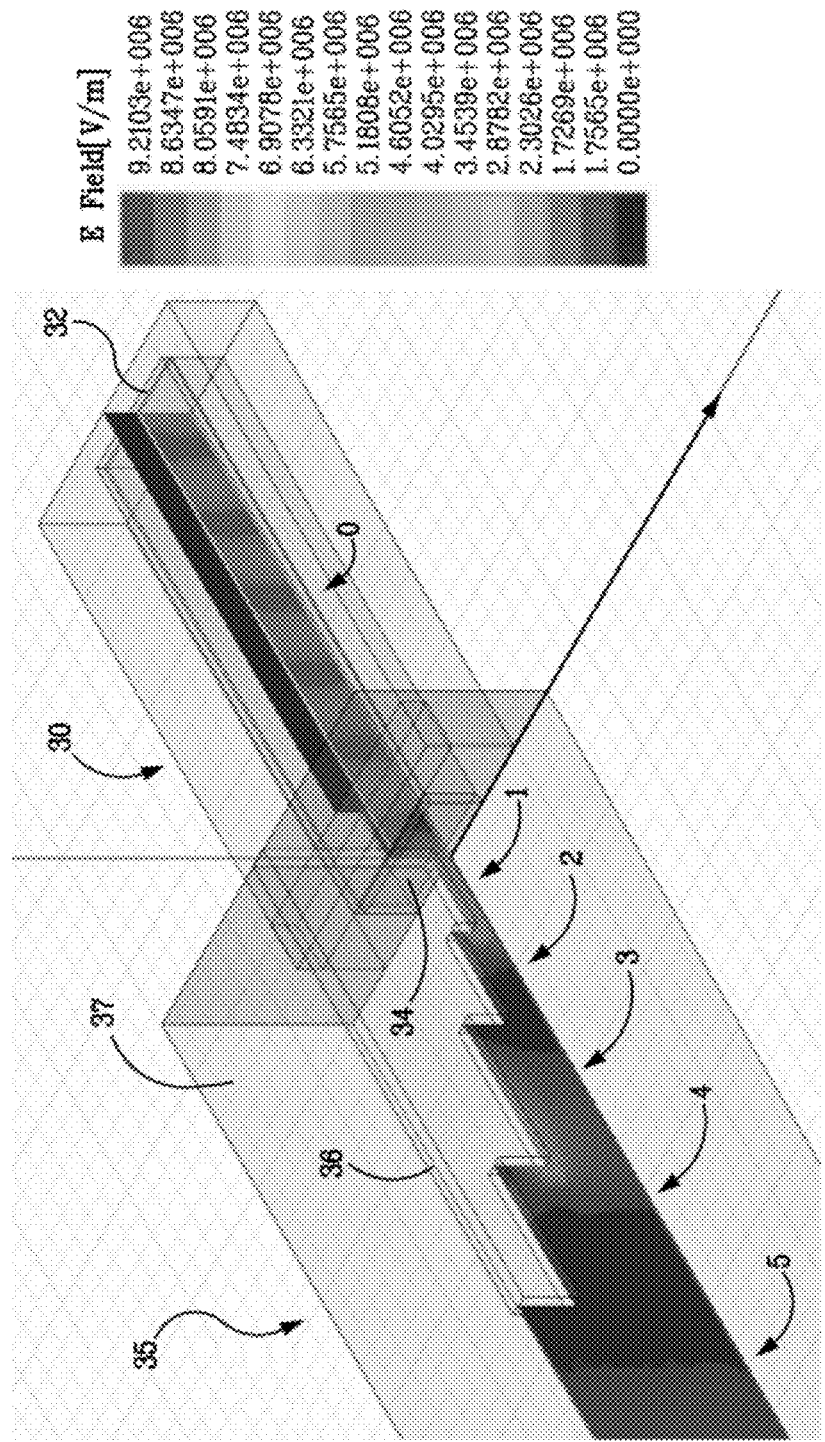
FIG. 7 is a 3D model of a laser (right) to a waveguide (left) stepped transition. A slice of the electric field at the central cross section of the waveguide is shown to expand to the left beneath the stepped (inverted) "ridge" to fill the waveguide mode.

The final simulated structure is illustrated in FIG. 7, showing the QCL 30 comprising a top waveguide layer 32 and end facet 34; hollow rectangular waveguide 35 comprising a top wall 37, stepped ridge waveguide transition 36; and stages 0-5. In general, the stepped ridge waveguide 36 can comprise a good electrical conductor, such as a metal. To ease fabrication, the ridge waveguide can be the same material as the waveguide, such as gold in the present example.

Figure 8:
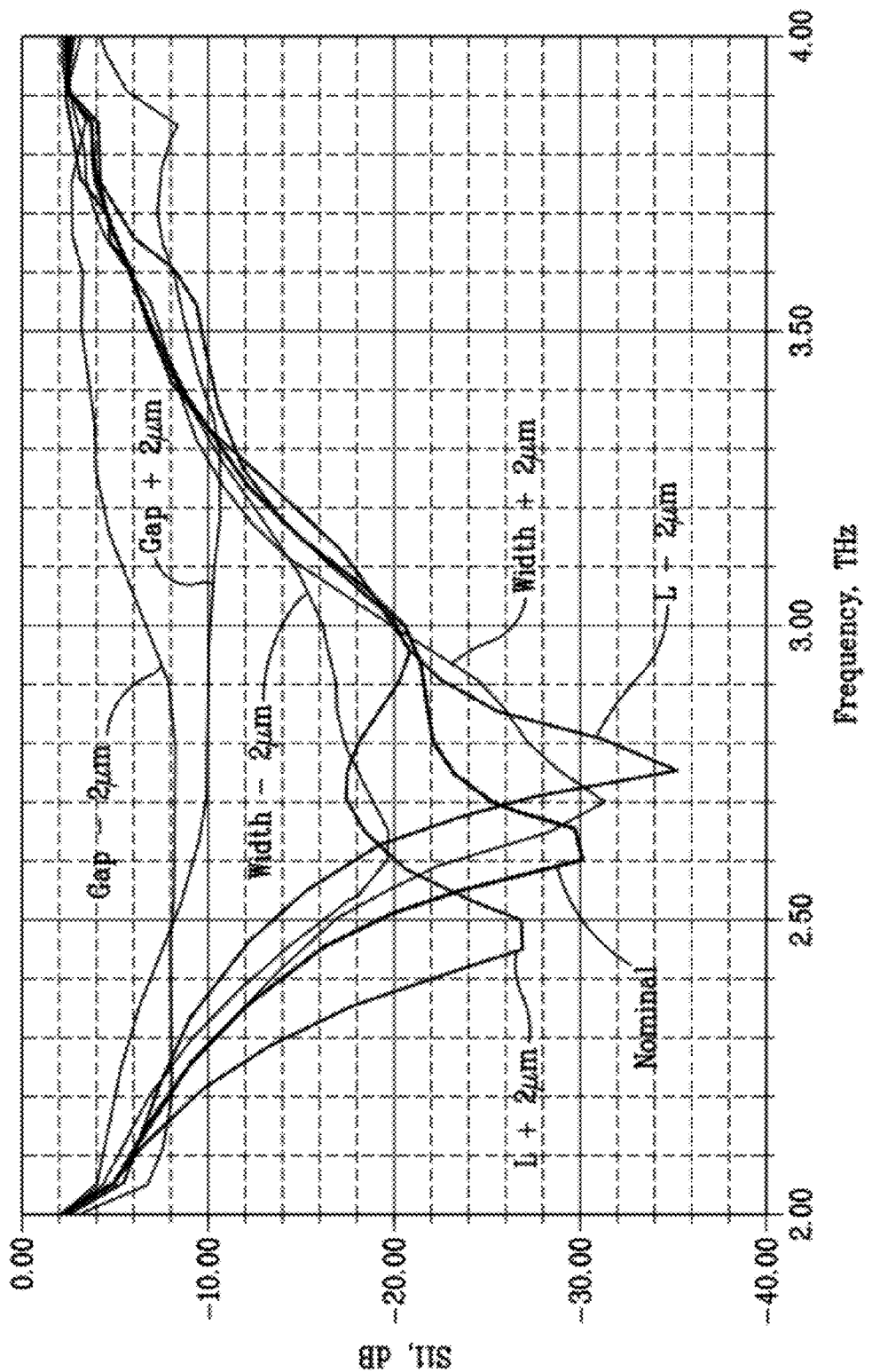
FIG. 8 is a graph of the simulated return loss and sensitivity of the laser to the stepped waveguide transition.

The simulated return loss and sensitivity to manufacturing tolerances is shown in FIG. 8. In particular, the design is very sensitive to the gap of the ridge waveguide section nearest the laser. The transition is less sensitive to the width, while the length of the sections shifts the frequency of best match.

Tapered QCL-RWG Transition

Figure 9:
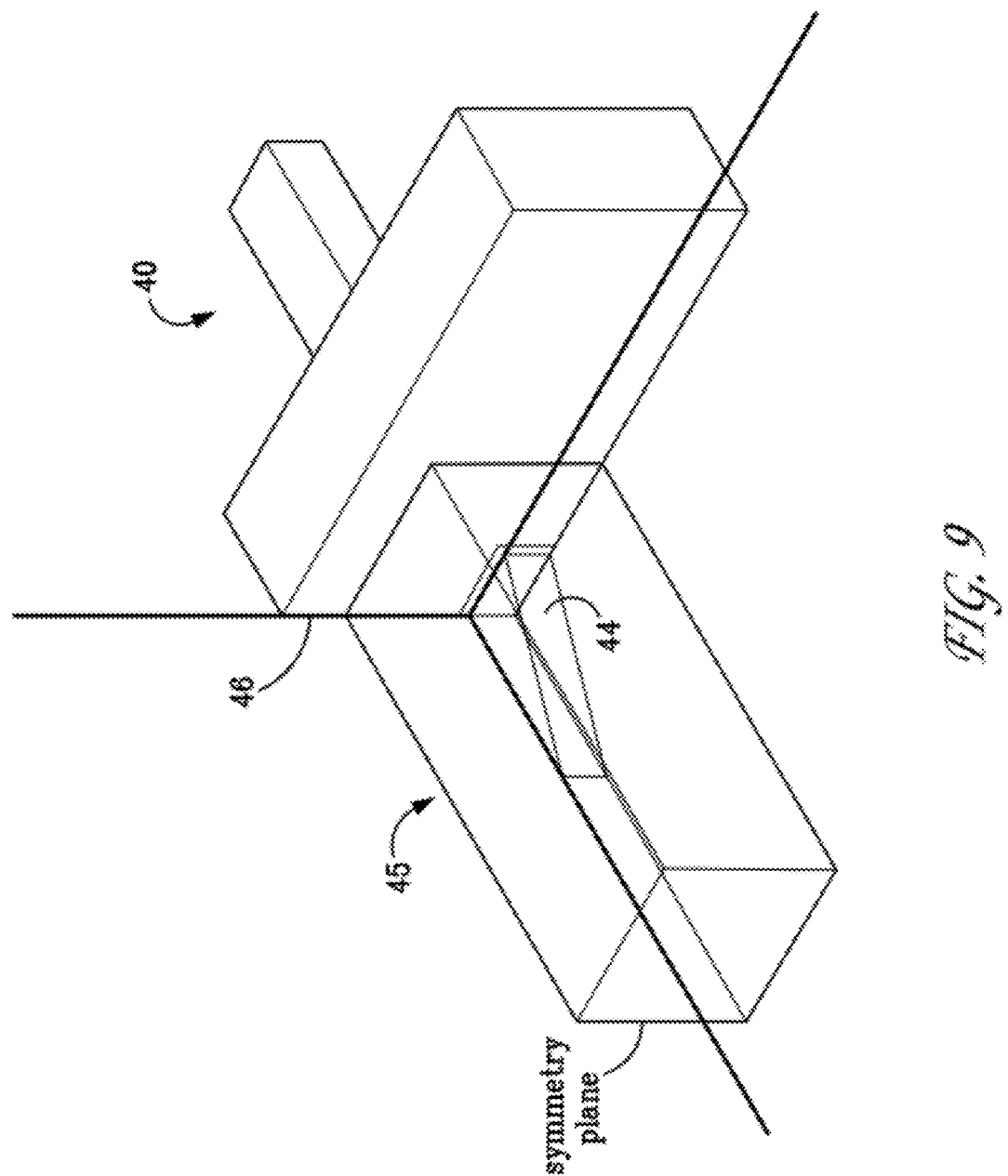
FIG. 9 is a half-model of a tapered QCL-RWG transition showing dielectric material extension into the waveguide. Only half of the model is shown due to symmetry about the center of the waveguide.

FIG. 9 shows an example of a tapered transition 44 comprising dielectric material extending from the end of the laser 40 through the back wall 46 into the rectangular waveguide 45. The model shows only half of the transition, with the model split along the E-field symmetry plane. Preferably, the tapered transition comprises a dielectric material with low loss. Preferably, the material has a dielectric constant between that of the laser and that of the rectangular waveguide. For ease of fabrication, the tapered transition can comprise the laser material, such as GaAs in the present example. In this case, the top contact metal of the laser does not extend into the waveguide with the laser material. While in reality, the material will have losses, in this case it was modeled as undoped GaAs for a simplified simulation.

Figure 10:
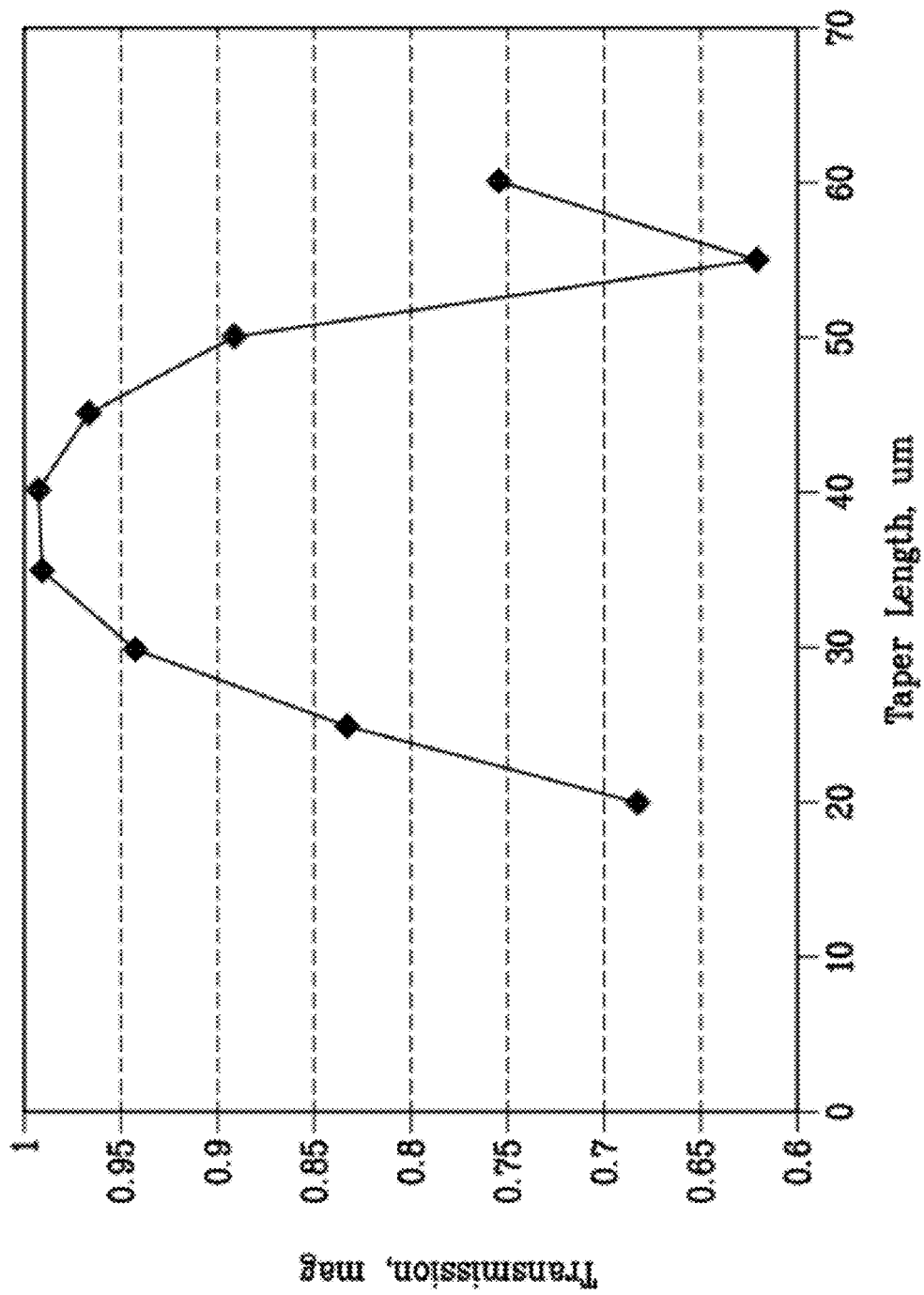
FIG. 10 is a graph of the transmission as a function of taper length for the tapered transition design.

The simulated transmission as a function of the length of the dielectric extension into the waveguide is shown in FIG. 10. The maximum transmission occurs at a length of 40 μm, which is approximately λ/2 in the dielectric-loaded waveguide. At the peak the facet transmission nears unity.

Figure 11:
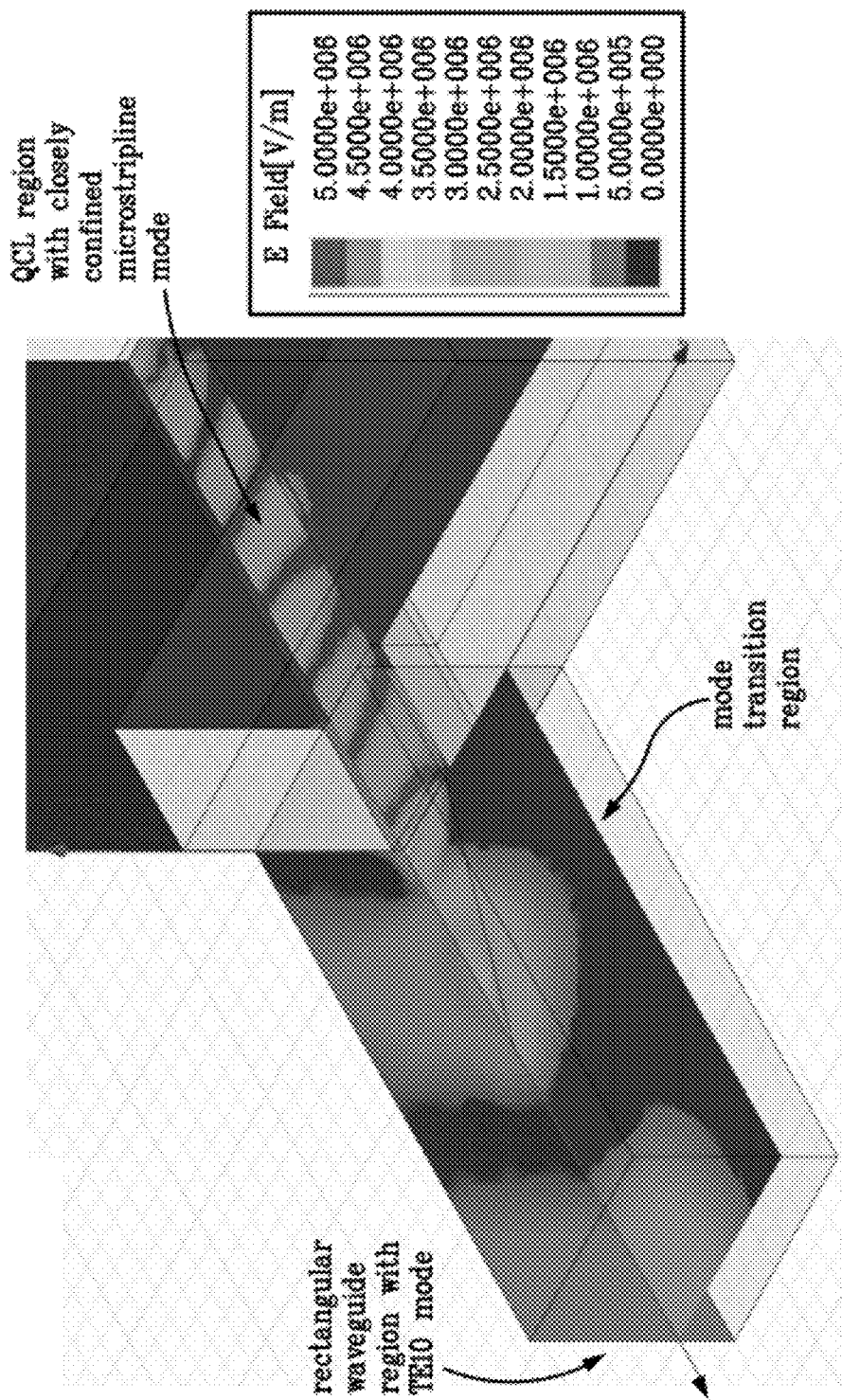
FIG. 11 is a simulation of the E-field expansion in the tapered QCL-RWG transition.

The expansion of the E-field is shown in FIG. 11. The field spot size gradually grows from the confined microstrip mode of the laser to the large mode of the rectangular waveguide. There is additional complexity at the interface and within the dielectric which is not clear from the image, but results in electric and magnetic fields that are locally directed along the direction of propagation in the vicinity of the interface. This elegant design has the distinct appealing advantage of requiring only a single processing step to define the waveguide transition region, showing transmission of up to 98% in a very simple design.

Characterization of Waveguide Integration

A variety of integrations of QCL lasers and waveguide components were fabricated on a chip as examples of the present invention. All of the lasers were the same and were 2000 μm long, ~10 μm tall, and 65 μm wide. The internal region of the rectangular waveguide was 37 μm high by 75 μm wide. The variations on this chip explored the insertion position dependence, waveguide length, H-plane and E-plane bends, magic tees and horns.

Figure 12:
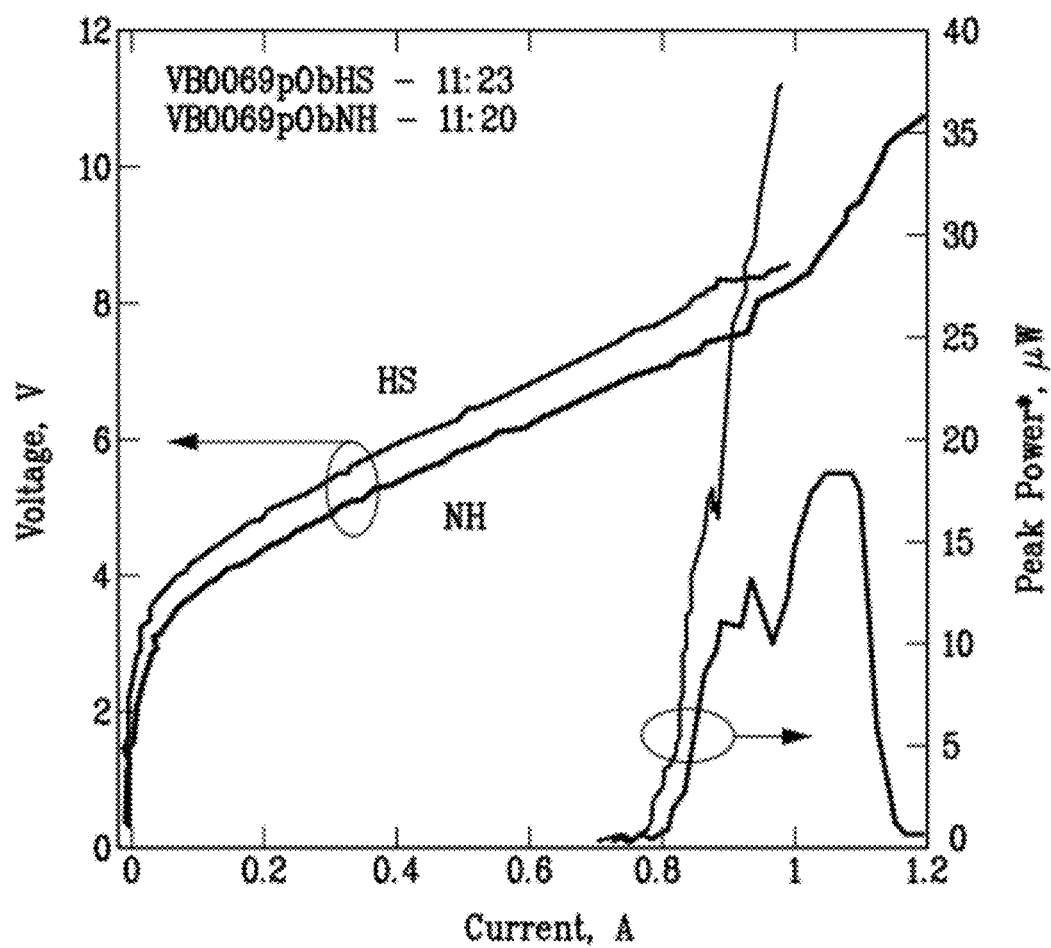
FIG. 12 is a graph of the pulsed light-current-voltage relation of an integrated laser with a waveguide (HS), and another laser on the same chip without a waveguide (NH).

The pulsed light-current-voltage (L-I-V) relation of the integrated laser with a waveguide (HS), and another laser on the same chip without a waveguide (NH) are compared in FIG. 12. The sample chip was cooled in a cryostat to 4° K. The emitted THz radiation passed through a Fourier transform infrared spectrometer to measure the spectra and was detected with a Si bolometer. The response of the bolometer was calibrated at this frequency, allowing an estimate of the peak power uncorrected for collection efficiency. The output powers for these two lasers were comparable to normal metal-metal waveguided lasers with similar laser material and comparable with each other, suggesting that the waveguides do not negatively impact power output.

Figure 13A:
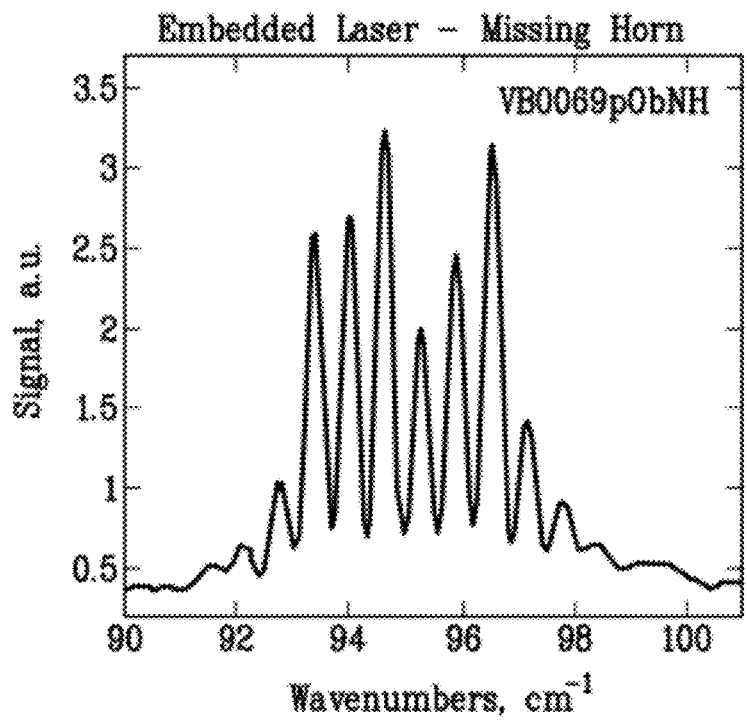
FIGS. 13A and 13B are spectra of lasers with and without a waveguide.
Figure 13B:
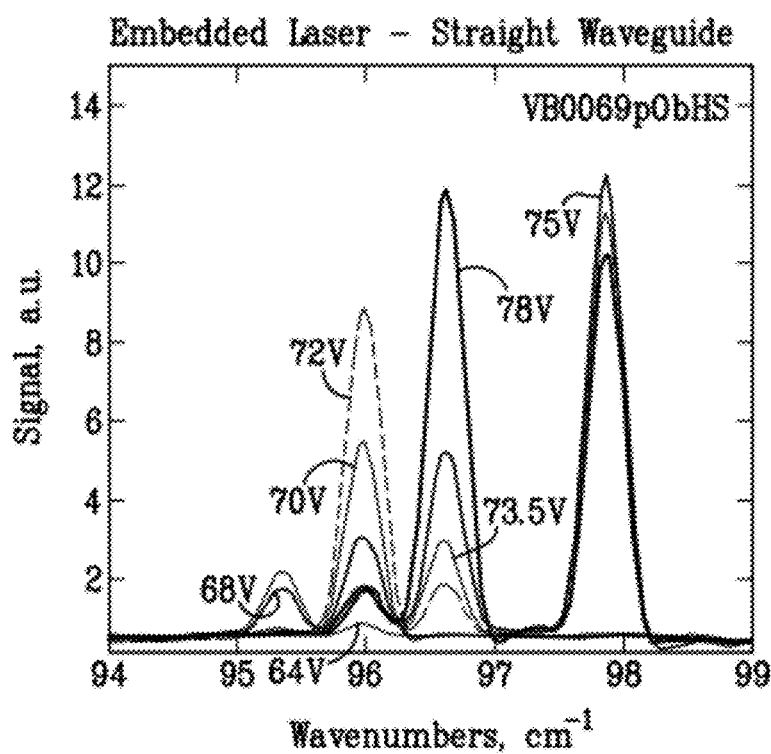

FIGS. 13A and 13B are spectra of two lasers—one with an integrated waveguide ("Embedded Laser-traight Waveguide") and one without ("Embedded Laser-Missing Horn"). The integrated waveguide had an abrupt output termination which has significant reflection. The laser without the horn exhibits a broad multi-mode Fabry-Perot spectrum, indicating a relatively broad gain bandwidth. The integrated waveguide spectrum is shifted to higher frequencies and has fewer longitudinal modes.

FIG. 14A shows an SEM image of two QCLs interfacing with short rectangular waveguides terminating into horn antennas. FIGS. 14B and 14C show the L-I-V and spectra. The laser operated with a low threshold power of less than 0.2 Watts. The sharp spike in FIG. 14C is the laser emission, which in this case is emitted into a single mode. The other spectral features are background light in the measurement path.

Figure 15:
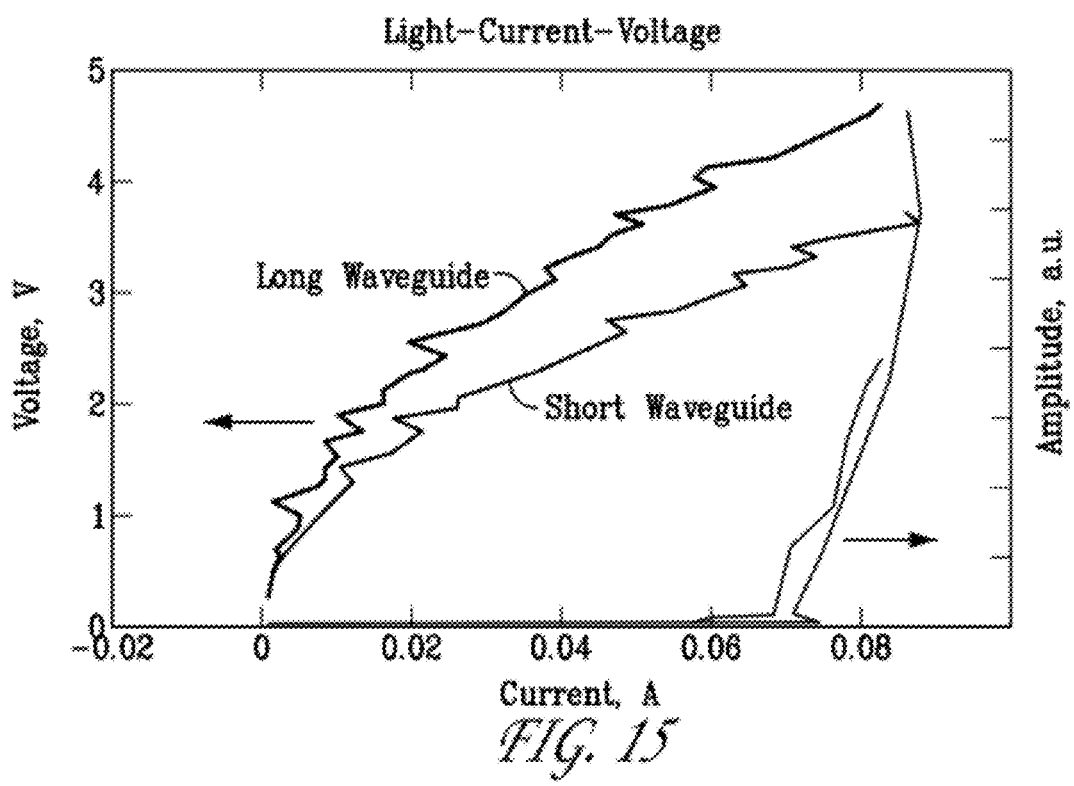
FIG. 15 is an L-I-V graph of laser emission from lasers integrated with long and short hollow waveguides.

FIG. 15 shows a graph of the L-I-V relation for a laser integrated with a long waveguide and another laser integrated with a short waveguide.

Figure 16:
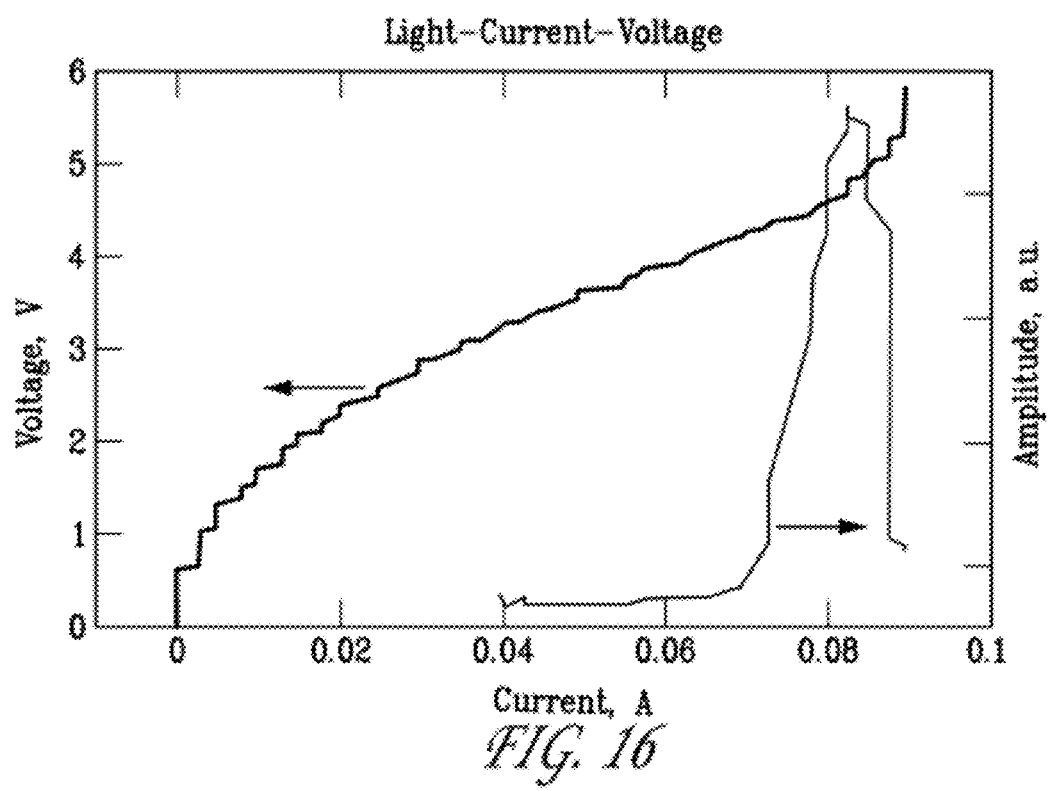
FIG. 16 is an L-I-V graph of laser emission exiting from an integrated waveguide with an E-plane bend and surface normal emission.

FIG. 16 shows the L-I-V relation for an E-plane bend with surface normal emission, in which the axis of the waveguide remains in a plane parallel to the direction of polarization. The vertically emitting integrated QCL-waveguide with the E-plane bend achieves what has been done previously only by surface grating-based devices. In this case, however, the surface emission is not distributed over the length of the laser, but rather localized at a port suitable for coupling to commercial horn antennas or other waveguides as well as allowing for various heat sinking schemes for cooling the laser ridge.

Figure 17:
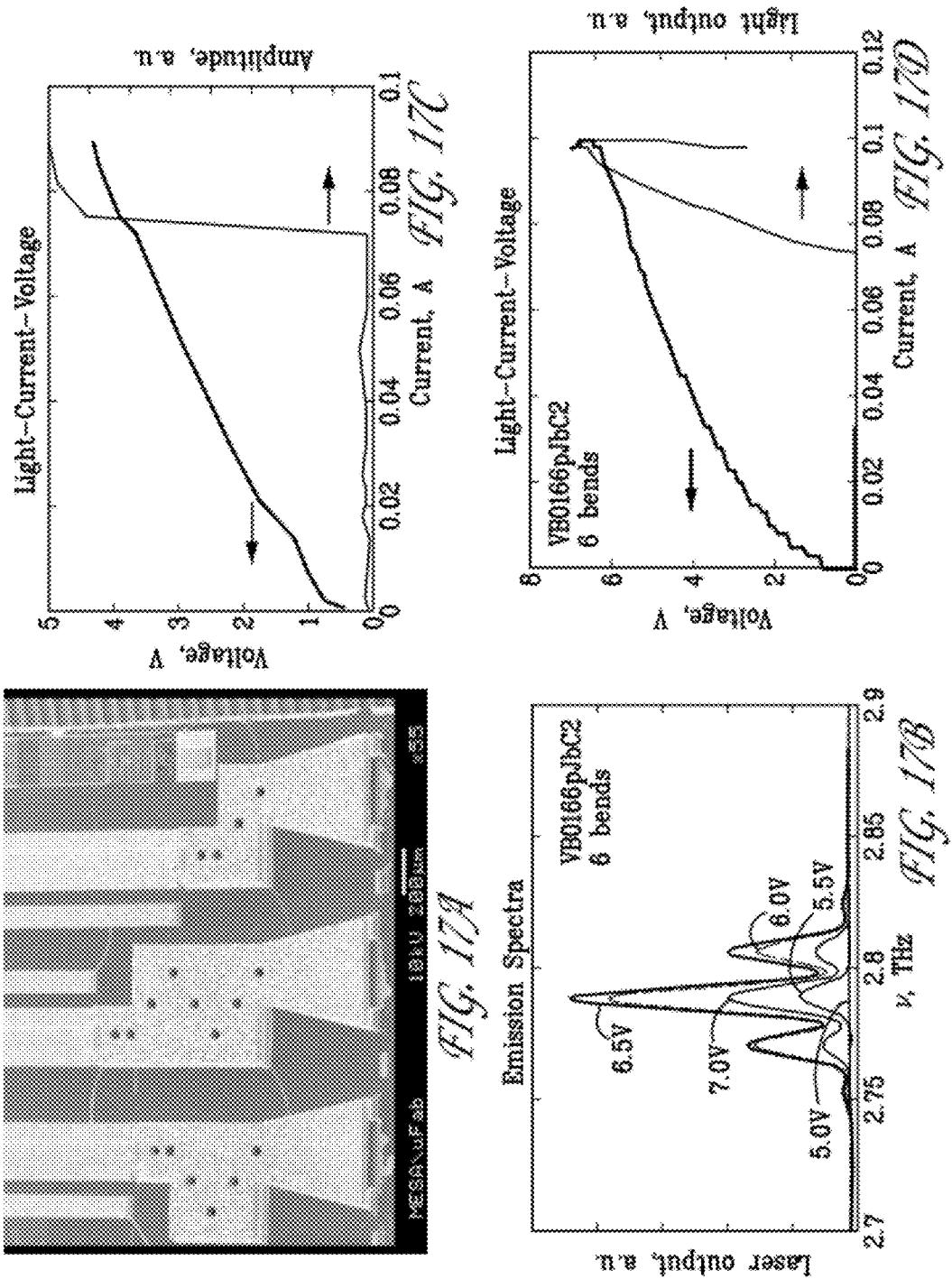
FIG. 17A is an SEM of waveguides with H-plane bends.
FIG. 17B are spectra for the 6 bend waveguide.
FIG. 17C is an L-I-V graph of the 2-bend.
FIG. 17D is an L-I-V graph of the 6-bend.

FIG. 17A is an SEM image of waveguides with H-plane bends, in which the axis of the waveguide remains in a plane parallel to the direction of magnetic H-field (transverse) polarization. FIG. 17B are spectra for a 6-bend waveguide. The spectral output is similar to devices without integrated horns. In particular, the mode spacing is uniform and agrees with the expected spacing assuming that the laser cavity alone is defining the allowed modes. This essentially demonstrates that the integrated waveguide has negligible influence over the laser frequency and, therefore, that reflections from the release holes and horn openings are indeed small, as designed. FIG. 17C is an L-I-V graph of a 2-bend waveguide. FIG. 17D is an L-I-V graph of the 6-bend. The similar threshold values for both lasers, which are normally identical except for the integrated waveguides, suggests that these is negligible reflection from the rectangular waveguide.

Terahertz Photonic Integrated Circuits

Figure 18:
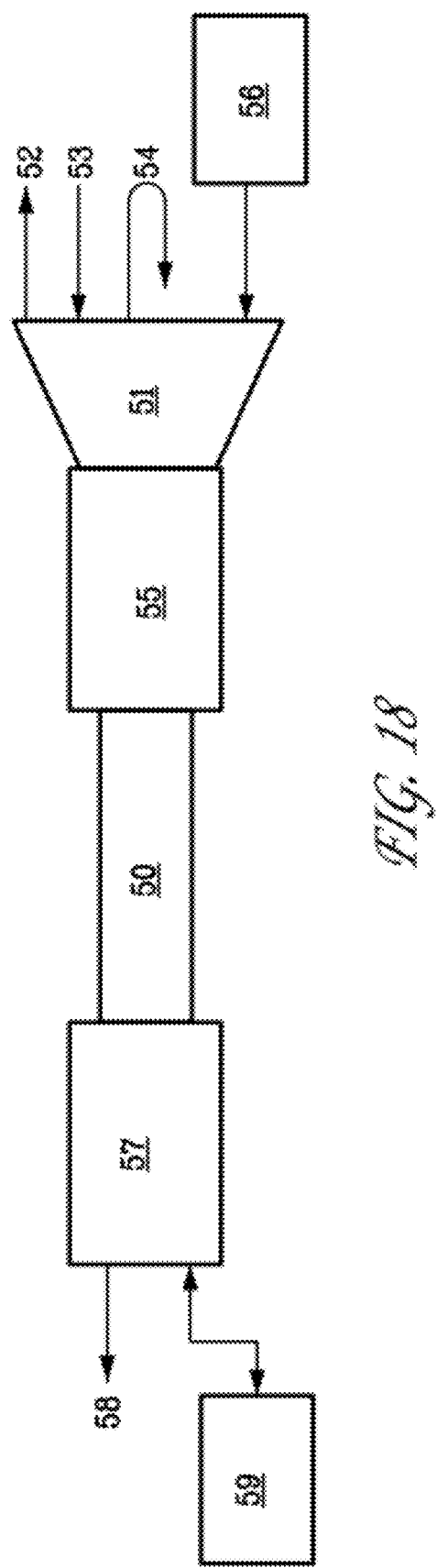
FIG. 18 is a schematic illustration of exemplary terahertz photonic integrated circuits.

A variety of components can be integrated on-chip with the QCL-waveguide to enable THz photonic integrated circuits, as shown schematically in FIG. 18. The ability to make additional passive waveguide components, such as splitters, combiners, tees, couplers, bends, etc., with the lithographic process enables complete THz photonic integrated circuits on a chip, whereby signals can be split, combined, and directed between multiple active components on the same chip.

For example, a horn 51 can be coupled to the open end of the waveguide 55 opposite the quantum cascade laser 50. The horn 51 can provide a nearly Gaussian far-field beam pattern of the laser light 52 extracted from the QCL which is good for coupling the QCL power to other components or for long distance propagation in free space.

Alternatively, external light 53 can be coupled from free space into the horn 51, which can increase coupling of external light into the quantum cascade laser by orders of magnitude, since the horn aperture can be large enough to collect all the incoming light. The external light coupled into the QCL can comprise return laser light 54 that was previously emitted by the QCL 50. This return laser light can be used to control the frequency of the quantum cascade laser. Alternatively, the external light coupled into the laser can originate from an external terahertz light source 56. The external terahertz light source 56 can comprise another quantum cascade laser, harmonic frequency upconverters pumped by microwave sources, or other means. The external light can be coupled into and amplified by the gain medium of the quantum cascade laser 50.

A second hollow waveguide 57 can be fabricated on the same substrate, wherein laser light from the other end of the quantum cascade laser 50 is coupled into the second hollow waveguide 57. This is a preferred arrangement when using the QCL gain medium as an amplifier or as the local oscillator for a heterodyne transceiver. In the case of an amplifier, providing a one-way pass of the injected radiation (especially when the interfaces are impedance matched) reduces or eliminates reflections that can feedback into the pumping source. In the case of a transceiver, the laser emission from one end facet of the QCL can be sent to a mixer detector, while the emission 58 for the other end facet can be sent off chip to transmit signals or interrogate targets.

An active device 59 can be provided on the same chip with the QCL-waveguide, wherein a waveguide couples laser light from the QCL 50 to the active device 59. Alternatively, the waveguide can couple external light from the active device 59 into the quantum cascade laser 50. In addition, waveguides can couple both the QCL light and externally generated light into the active device, which can be a heterodyne receiver. If the active device 59 is on the same chip, it can be coupled to the waveguide directly without a horn (as shown).

The present invention has been described as integration of a quantum cascade laser with a hollow waveguide. It will be understood that the above description is merely illustrative of the applications of the principles of the present invention, the scope of which is to be determined by the claims viewed in light of the specification. Other variants and modifications of the invention will be apparent to those of skill in the art.

We claim:

1. An integrated quantum cascade laser and rectangular waveguide device, comprising:
    a substrate;
    a metallic hollow waveguide on the substrate;
    a quantum cascade laser, comprising a metal-metal waveguided heterostructure active region for generation of laser light, on the substrate; and
    an interface between an end facet of the quantum cascade laser and an entrance end of the hollow waveguide for coupling of the laser light from the quantum cascade laser into the hollow waveguide or for coupling external light from the hollow waveguide into the quantum cascade laser.

2. The device of claim 1, wherein the frequency of the laser light is greater than 1 terahertz.

3. The device of claim 1, wherein the quantum cascade laser is an edge emitting laser with an E-field polarization normal to the surface of the substrate.

4. The device of claim 1, wherein the end facet is coated with a transparent insulator.

5. The device of claim 1, wherein the interface comprises an abrupt transition.

6. The device of claim 5, wherein the abrupt transition comprises a vertical or non-vertical etched wall end facet of the quantum cascade laser that is embedded in the entrance end of the hollow waveguide.

7. The device of claim 1, wherein the interface comprises a stepped transition.

8. The device of claim 7, wherein the stepped transition comprises a ridge waveguide.

9. The device of claim 8, wherein the ridge waveguide comprises a metal.

10. The device of claim 1, wherein the interface comprises a tapered transition.

11. The device of claim of claim 10, wherein the tapered transition comprises a dielectric.

12. The device of claim 1, wherein the interface is adapted to match the impedance of the quantum cascade laser to the impedance of the hollow waveguide.

13. The device of claim 1, wherein the interface is adapted to match the laser facet loss to the laser cavity loss to improve the efficiency of the quantum cascade laser.

14. The device of claim 1, wherein the interface is adapted to optimize the output power of the quantum cascade laser.

15. The device of claim 1, wherein the hollow waveguide comprises a single-mode waveguide.

16. The device of claim 1, wherein the hollow waveguide comprises a multi-mode waveguide.

17. The device of claim 1, wherein the hollow waveguide comprises a rectangular waveguide.

18. The device of claim 17, wherein the rectangular waveguide comprises an E-plane bend.

19. The device of claim 17, wherein the rectangular waveguide comprises an H-plane bend.

20. The device of claim 1, further comprising a horn coupled to an open end of the waveguide.

21. The device of claim 20, wherein the horn is adapted to provide a nearly Gaussian far-field beam pattern of the laser light from the quantum cascade laser.

22. The device of claim 20, wherein the external light is coupled from free space into the horn.

23. The device of claim 1, wherein the external light coupled into the quantum cascade laser comprises return laser light that was previously emitted by the quantum cascade laser.

24. The device of claim 23, wherein the return laser light is used to control the frequency of the quantum cascade laser.

25. The device of claim 1, further comprising an external terahertz light source for generation of the external light.

26. The device of claim 25, wherein the external terahertz light source comprises a quantum cascade laser.

27. The device of claim 1, further comprising a second hollow waveguide on the substrate, wherein laser light from the other end of the quantum cascade laser is coupled into the second hollow waveguide.

28. The device of claim 1, further comprising an active device on the substrate, wherein the waveguide couples laser light from the quantum cascade laser to the active device.

29. The device of claim 1, further comprising an active device on the substrate, wherein the waveguide couples external light from the active device into the quantum cascade laser.

30. The device of claim 1, further comprising an external cavity adapted to provide feedback to enable lasing and tuning of the quantum cascade laser emission frequency.

* * * * *